United States Patent
Shi et al.

(10) Patent No.: US 11,667,839 B2
(45) Date of Patent: *Jun. 6, 2023

(54) LOW OXIDE TRENCH DISHING CHEMICAL MECHANICAL POLISHING

(71) Applicant: Versum Materials US, LLC, Tempe, AZ (US)

(72) Inventors: Xiaobo Shi, Chandler, AZ (US); Krishna P. Murella, Phoenix, AZ (US); Joseph D. Rose, Gilbert, AZ (US); Hongjun Zhou, Chandler, AZ (US); Mark Leonard O'Neill, Queen Creek, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/354,311

(22) Filed: Jun. 22, 2021

(65) Prior Publication Data

US 2021/0324270 A1  Oct. 21, 2021

Related U.S. Application Data

(62) Division of application No. 16/450,784, filed on Jun. 24, 2019, now Pat. No. 11,078,417.

(60) Provisional application No. 62/692,639, filed on Jun. 29, 2018, provisional application No. 62/692,633, filed on Jun. 29, 2018.

(51) Int. Cl.
*C09K 13/00* (2006.01)
*C09K 13/02* (2006.01)
*C09K 13/06* (2006.01)
*H01L 21/3105* (2006.01)

(52) U.S. Cl.
CPC .............. *C09K 13/00* (2013.01); *C09K 13/02* (2013.01); *C09K 13/06* (2013.01); *H01L 21/31053* (2013.01)

(58) Field of Classification Search
None
See application file for complete search history.

(56) References Cited

U.S. PATENT DOCUMENTS 5,028,620 A  7/1991  Hsu
5,876,490 A  3/1999  Ronay
(Continued)

FOREIGN PATENT DOCUMENTS

EP  2500929 A1  9/2012
KR  20160079328 A  7/2016
(Continued)

*Primary Examiner* — Roberts P Culbert
(74) *Attorney, Agent, or Firm* — Lina Yang

(57) ABSTRACT

Chemical mechanical planarization (CMP) polishing compositions, methods and systems are provided to reduce oxide trench dishing and improve over-polishing window stability. High and tunable silicon oxide removal rates, low silicon nitride removal rates, and tunable $SiO_2$:SiN selectivity are also provided. The compositions use unique chemical additives, such as maltitol, lactitol, maltotritol, ribitol, D-sorbitol, mannitol, dulcitol, iditol, D-(−)-Fructose, sorbitan, sucrose, ribose, Inositol, glucose, D-arabinose, L-arabinose, D-mannose, L-mannose, meso-erythritol, beta-lactose, arabinose, or combinations thereof as oxide trench dishing reducing additives.

9 Claims, 2 Drawing Sheets

(56) References Cited

U.S. PATENT DOCUMENTS

| | | |
|---|---|---|
| 6,544,892 B2 | 4/2003 | Srinivasan et al. |
| 6,616,514 B1 | 9/2003 | Edelbach et al. |
| 6,964,923 B1 | 11/2005 | Ronay |
| 2012/0077419 A1 | 3/2012 | Zhang |
| 2013/0248756 A1 | 9/2013 | Venkataraman |
| 2016/0200944 A1 | 7/2016 | Zhou et al. |
| 2019/0211245 A1* | 7/2019 | Choi .................. C09K 3/1436 |

FOREIGN PATENT DOCUMENTS

| | | |
|---|---|---|
| TW | 201625767 | 7/2016 |
| WO | 2006001558 A1 | 1/2006 |
| WO | 2012032461 A1 | 3/2012 |
| WO | 2012032466 A1 | 3/2012 |
| WO | 2013035034 A1 | 3/2013 |
| WO | 2013093557 A1 | 6/2013 |
| WO | 2018062401 A1 | 4/2018 |

\* cited by examiner

LOW OXIDE TRENCH DISHING CHEMICAL MECHANICAL POLISHING

CROSS REFERENCE TO RELATED PATENT APPLICATIONS

The application is a divisional application of U.S. application Ser. No. 16/450,784 filed on Jun. 24, 2019 which claims the 35 U.S.C. § 119(e) to earlier filed U.S. patent applications Ser. Nos. 62/692,633, and 62/692,639 filed on Jun. 29, 2018, which are entirely incorporated herein by reference.

BACKGROUND OF THE INVENTION

This invention relates to the chemical mechanical planarization (CMP) of oxide and doped oxide films.

In the fabrication of microelectronics devices, an important step involved is polishing, especially surfaces for chemical-mechanical polishing for the purpose of recovering a selected material and/or planarizing the structure.

For example, a SiN layer is deposited under a $SiO_2$ layer to serve as a polish stop. The role of such polish stop is particularly important in Shallow Trench Isolation (STI) structures. Selectivity is characteristically expressed as the ratio of the oxide polish rate to the nitride polish rate. An example is an increased polishing selectivity rate of silicon dioxide ($SiO_2$) as compared to silicon nitride (SiN).

In the global planarization of patterned structures, reducing oxide trench dishing is a key factor to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in CMP polishing compositions.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876,490. Ceria, alumina, silica & zirconia are used as abrasives. Molecular weight for such listed polyelectrolyte is from 300 to 20,000, but in overall, <100,000.

U.S. Pat. No. 6,616,514 discloses a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

U.S. Pat. No. 6,544,892 teaches the polishing compositions containing using abrasive, and an organic compound having a carboxylic acid functional group and a second functional group selected from amines and halides. Ceria particles were used as abrasives.

However, those prior disclosed Shallow Trench Isolation (STI) polishing compositions did not address the importance of oxide trench dishing reducing.

It should be readily apparent from the foregoing that there remains a need within the art for compositions, methods and systems of chemical mechanical polishing that can afford the reduced oxide trench dishing and improved over polishing window stability in a chemical and mechanical polishing (CMP) process, in addition to high removal rate of silicon dioxide as well as high selectivity for silicon dioxide to silicon nitride.

BRIEF SUMMARY OF THE INVENTION

The present invention provides Chemical mechanical polishing (CMP) polishing compositions, methods and systems for a reduced oxide trench dishing and thus improved over polishing window stability by introducing chemical additives as oxide trench dishing reducing additives compositions at wide pH range including acidic, neutral and alkaline pH conditions.

The present invention also provides the benefits of achieving high oxide film removal rates, low SiN film removal rates, high and tunable Oxide:SiN selectivity, lower total defect counts post-polishing, and excellent mean particle size (nm) stability.

In one aspect, there is provided a CMP polishing composition comprises:
abrasive particles selected from the group consisting of inorganic oxide particles, metal-coated inorganic oxide particles, organic polymer particles, metal oxide-coated organic polymer particles and combinations thereof;
chemical additive as oxide trenching dishing reducer,
a solvent; and
optionally
biocide; and
pH adjuster;
wherein the composition has a pH of 2 to 12, preferably 3 to 10, and more preferably 4 to 9.

The inorganic oxide particles include but are not limited to ceria, colloidal silica, high purity colloidal silica, colloidal ceria, alumina, titania, zirconia particles.

An example of ceria particles are calcined ceria particles. An example of calcined ceria particles are calcined ceria particles manufactured from milling process.

An example of colloidal ceria particles is typically manufactured from chemical reactions and crystallization processes.

The metal-coated inorganic oxide particles include but are not limited to the ceria-coated inorganic oxide particles, such as, ceria-coated colloidal silica, ceria-coated high purity colloidal silica, ceria-coated alumina, ceria-coated titania, ceria-coated zirconia, or any other ceria-coated inorganic oxide particles.

The organic polymer particles include, but are not limited to, polystyrene particles, polyurethane particle, polyacrylate particles, or any other organic polymer particles.

The metal-coated organic polymer particles are selected from the group consisting of ceria-coated organic polymer particles, zirconia-coated organic polymer particles, silica-coated organic polymer particles, and combinations thereof.

The preferred abrasive particles are ceria-coated inorganic oxide particles and ceria particle. More preferred abrasive particles are ceria-coated silica particles and calcined ceria particles.

The solvent includes but is not limited to deionized (DI) water, distilled water, and alcoholic organic solvents.

The chemical additives as oxide trenching dishing reducers contain at least two or more, preferably four or more, more preferably six or more hydroxyl functional groups in their molecular structures.

In one embodiment, the chemical additive has a general molecular structure as shown below:

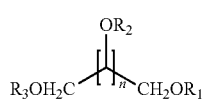

In the general molecular structure, n is selected from 2 to 5,000, from 3 to 12, preferably from 4 to 7.

R1, R2, and R3 can be the same or different atoms or functional groups.

Each of Rs in the group of R1 to R3 can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four of them are hydrogen atoms.

When R1, R2, and R3 are the same and are hydrogen atoms, the chemical additive bears multi hydroxyl functional groups.

The molecular structures of some examples of such chemical additives are listed below:

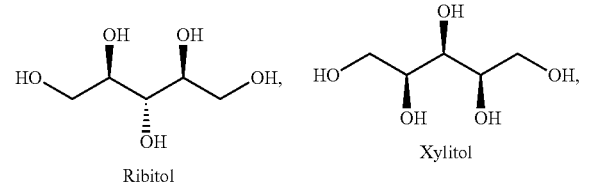

Ribitol

Xylitol

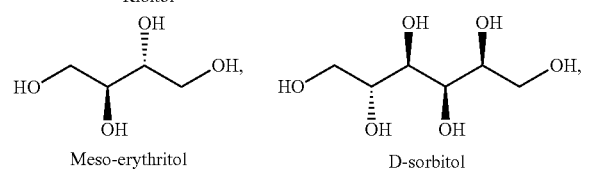

Meso-erythritol

D-sorbitol

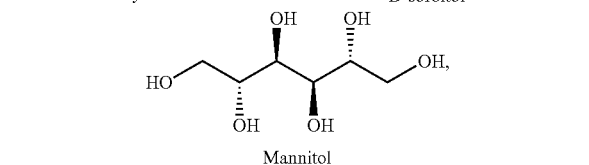

Mannitol

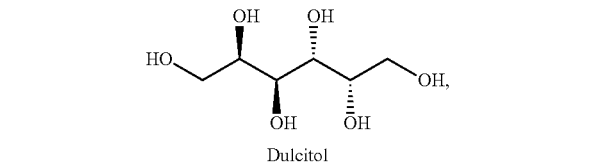

Dulcitol

Iditol

In another embodiment, the chemical additive has a structure shown below:

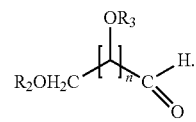

In this structure, one —CHO functional group is located at one end of the molecule as the terminal functional group; n is selected from 2 to 5,000, from 3 to 12, preferably from 4 to 7.

Each of R1 and R2 can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof.

When R1 and R2 are all hydrogen atoms, and n=3, the chemical additive is D-arabinose or L-arabinose:

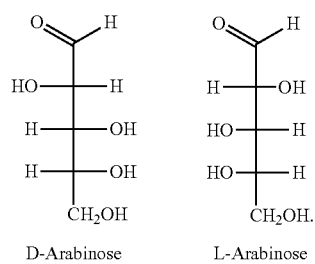

D-Arabinose   L-Arabinose

When R1 and R2 are all hydrogen atoms, and n=4, the chemical additive is D-mannose or L-mannose.

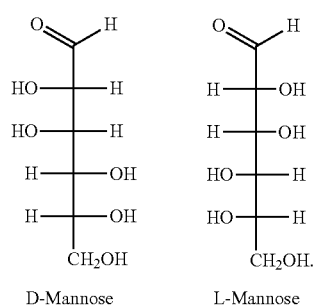

D-Mannose   L-Mannose

In yet another embodiment, the chemical additive has a molecular structure selected from the group comprising of at least one (f), at least one (g), at least one (h) and combinations thereof;

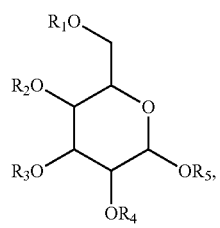

(f)

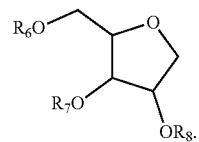

(g)

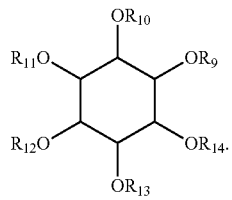

(h)

In these general molecular structures; R1, R2, R3, R4, R5, R6, R7 R8, R9, R10, R11, R12, R13, and R14 can be the same or different atoms or functional groups.

They can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four or more of them are hydrogen atoms.

When R1, R2, R3 R4, R5, R6, R7 R8, R9, R10, R11, R12, R13, and R14 are all hydrogen atoms which provide the chemical additives bearing multi hydroxyl functional groups.

The molecular structures of some examples of such chemical additives are listed below:

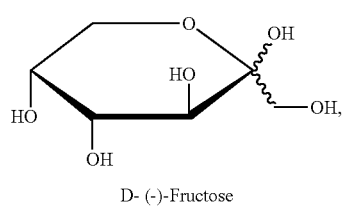

D-(-)-Fructose

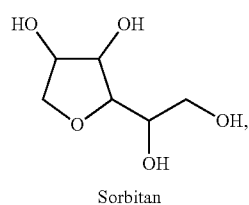

Sorbitan

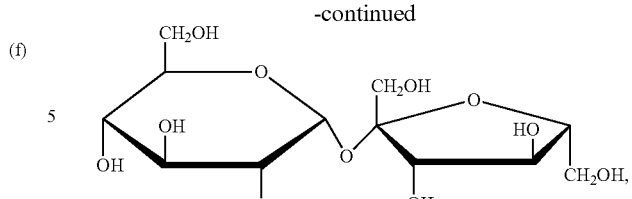

Sucrose

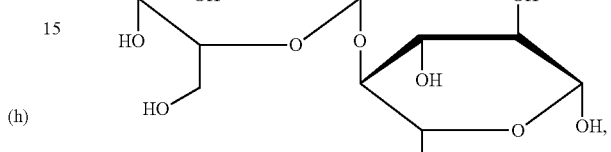

beta-lactose

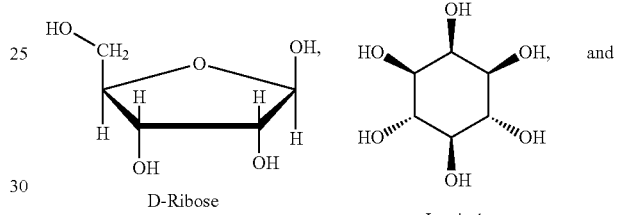

D-Ribose     Inositol

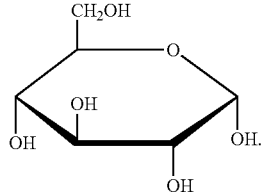

Glucose

Yet, in another embodiment, the chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing hydroxyl groups.

The chemical additives as oxide trenching dishing reducers contain at least two, at least four, or at least six hydroxyl functional groups in their molecular structures.

The general molecular structure for the chemical additives is shown in (a):

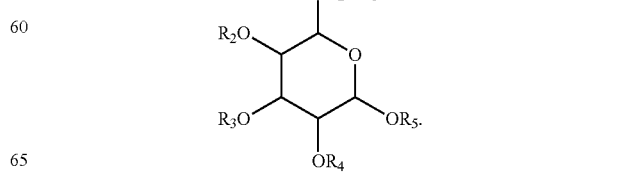

(a)

In one embodiment, at least one R in the group of R1 to R5 in the general molecular structure is a polyol molecular unit having a structure shown in (b):

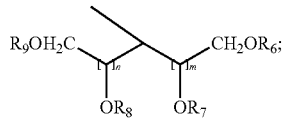

(b)

wherein n and m can be the same or different. m or n is independently selected from 1 to 5, preferably from 1 to 4, more preferably from 1 to 3, and most preferably from 1 to 2; R6 to R9 can be the same or different atoms or functional groups; and the rest of Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

In another embodiment, at least one R in the group of R1 to R5 in the general molecular structure is a polyol molecular unit having a structure shown in (b); at least one R in the group of R1 to R5 in the general molecular structure is a six-member ring polyol as shown in (c):

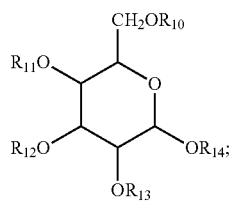

(c)

wherein
one of OR in group of OR11, OR12, OR13 and OR14 will be replaced by O in structure (a); and R10 and each of other R in the group of R10, R11, R13 and R14 is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;

and the rest of Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

In the general molecular structure, at least two, preferably four, more preferably six of the Rs in the group of R1 to R9 are hydrogen atoms.

When only one R, such as R5 in the group of R1 to R5 in the general molecular structure is a polyol molecular unit (b) having n=2 and m=1; and all rest of Rs in the group of R1 to R9 are all hydrogen atoms, the following two chemical additives are obtained:

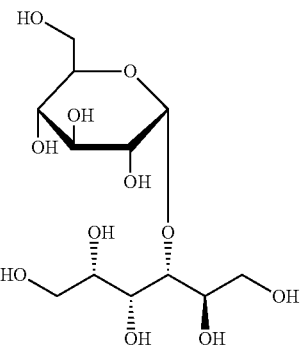

Maltitol

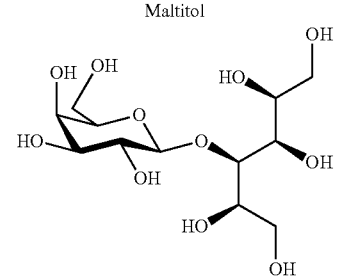

Lactitol

When one R, such as R5 is a polyol molecular unit (b) having n=2 and m=1; and one R, such as R2 is a six-member ring polyol; and all rest of Rs in the group of R1 to R14 are all hydrogen atoms, the following chemical additive is obtained:

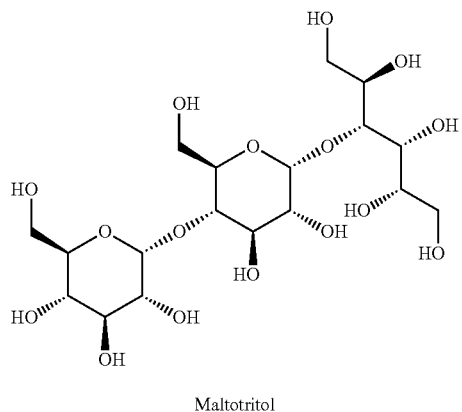 [SMILES: OC[C@@H](O)[C@@H](O[C@H]1O[C@H](CO)[C@@H](O[C@H]2O[C@H](CO)[C@@H](O)[C@H](O)[C@H]2O)[C@H](O)[C@H]1O)[C@H](O)[C@@H](O)CO]

Maltotritol

The chemical additive comprises maltitol, lactitol, maltotritol, ribitol, D-sorbitol, mannitol, dulcitol, iditol, D-(−)-Fructose, sorbitan, sucrose, ribose, Inositol, glucose, D-arabinose, L-arabinose, D-mannose, L-mannose, meso-erythritol, beta-lactose, arabinose, and combinations thereof. The preferred chemical additives are maltitol, lactitol, maltotritol, D-sorbitol, mannitol, dulcitol, iditol, D-(−)-Fructose, sucrose, ribose, Inositol, glucose. D-mannose, L-mannose, beta-lactose, and combinations thereof. The more preferred chemical additives are maltitol, lactitol, maltotritol, D-sorbitol, mannitol, dulcitol, D-(−)-Fructose, beta-lactose, and combinations thereof.

In some embodiments, the CMP polishing compositions can be made into two or more parts and mixed at the point of use.

In another aspect, there is provided a method of chemical mechanical polishing (CMP) a substrate having at least one surface comprising silicon dioxide (such tetraethyl orthosilicate or TEOS) using the chemical mechanical polishing (CMP) composition described above.

In yet another aspect, there is provided a system of chemical mechanical polishing (CMP) a substrate having at least one surface comprising silicon dioxide using the chemical mechanical polishing (CMP) composition described above.

The polished oxide films can be Chemical vapor deposition (CVD), Plasma Enhance CVD (PECVD), High Density Deposition CVD (HDP), spin on oxide films, flowable CVD oxide film, carbon doped oxide film, nitrogen doped oxide film, or combinations thereof.

The substrate disclosed above can further comprises a silicon nitride (SiN) surface. The removal selectivity of $SiO_2$:SiN is greater than 10, preferably greater than 20, and more preferably greater than 30.

DETAILED DESCRIPTION OF THE INVENTION

Figure 1:
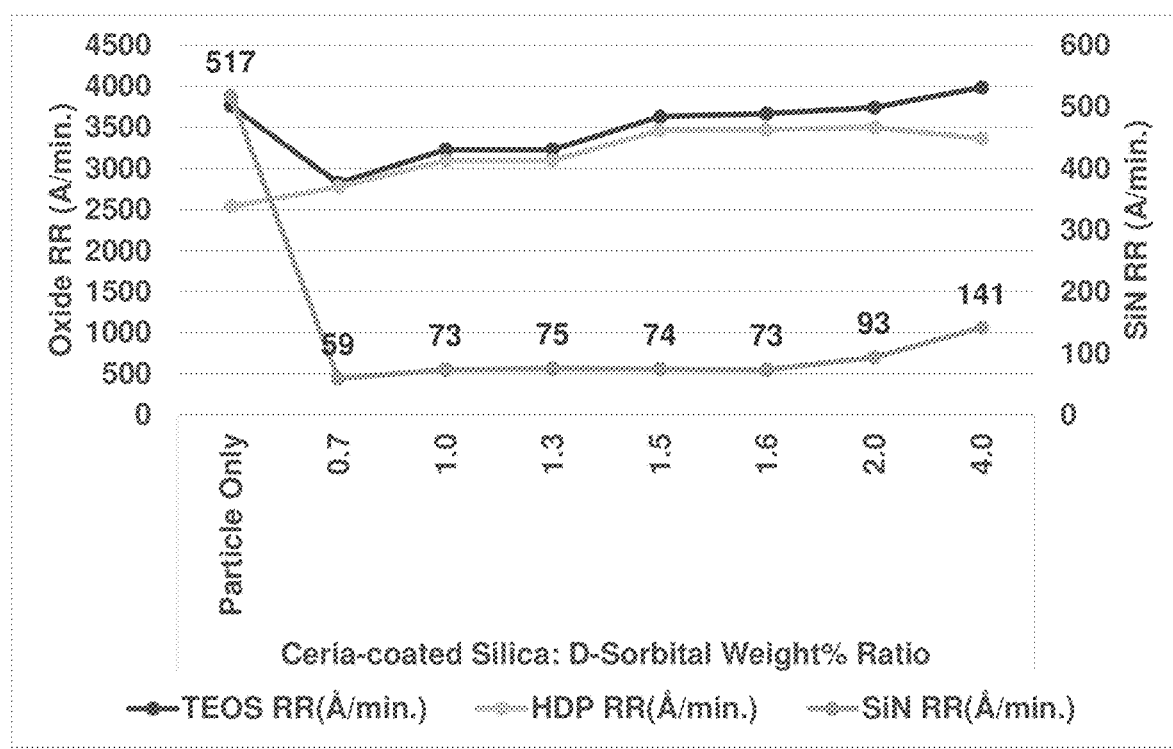
FIG. 1. Depicts the effects of Ceria-coated Silica/D-Sorbitol Ratio on Film RR (A/min.)

This invention relates to the Chemical mechanical polishing (CMP) compositions, methods and systems for oxide and doped oxide films polishing.

In the global planarization of patterned structures, reducing oxide trench dishing is a key factor to be considered. The lower trench oxide loss will prevent electrical current leaking between adjacent transistors. Non-uniform trench oxide loss across die or/and within Die will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in CMP polishing compositions.

The CMP compositions comprise the unique combination of abrasive particles and the suitable chemical additives, such as maltitol, lactitol, and maltotritol, or any other chemical molecules with similar molecular structures and functional groups.

This invention provides a reduced oxide trench dishing and thus improved over polishing window stability by introducing chemical additives as oxide trench dishing reducing additives in the Chemical mechanical polishing (CMP) compositions at wide pH range including acidic, neutral and alkaline pH conditions.

The Chemical Mechanical Polishing (CMP) compositions provide high oxide film removal rates, low SiN film removal rates and high $SiO_2$:SiN selectivity.

The Chemical Mechanical Polishing (CMP) compositions also provided significant total defect count reduction while comparing the CMP polishing compositions using calcinated ceria particles as abrasives.

The Chemical Mechanical Polishing (CMP) composition also further provides excellent mean particle size and size distribution stability for the abrasive particles which is very important in maintaining robust CMP polishing performances with minimized polishing performance variations.

In one aspect, there is provided a CMP polishing composition comprises:
abrasive particles selected from the group consisting of inorganic oxide particles, metal-coated inorganic oxide particles, organic polymer particles, metal oxide-coated organic polymer particles and combinations thereof;
chemical additive as oxide trenching dishing reducer,
a solvent; and
optionally
biocide; and
pH adjuster;
wherein the composition has a pH of 2 to 12, preferably 3 to 10, and more preferably 4 to 9.

The inorganic oxide particles include but are not limited to ceria, colloidal silica, high purity colloidal silica, colloidal ceria, alumina, titania, zirconia particles.

An example of ceria particles are calcined ceria particles. An example of calcined ceria particles are calcined ceria particles manufactured from milling process.

An example of colloidal ceria particles is typically manufactured from chemical reactions and crystallization processes.

The metal-coated inorganic oxide particles include but are not limited to the ceria-coated inorganic oxide particles, such as, ceria-coated colloidal silica, ceria-coated high purity colloidal silica, ceria-coated alumina, ceria-coated titania, ceria-coated zirconia, or any other ceria-coated inorganic oxide particles.

The organic polymer particles include, but are not limited to, polystyrene particles, polyurethane particle, polyacrylate particles, or any other organic polymer particles.

The metal-coated organic polymer particles are selected from the group consisting of ceria-coated organic polymer particles, zirconia-coated organic polymer particles, silica-coated organic polymer particles, and combinations thereof;

The average mean particle sizes or mean particle sizes (MPS) of the abrasive particles are ranged from 2 to 1,000 nm, 5 to 500 nm, 15 to 400 nm or 25 to 250 nm. MPS refers to diameter of the particles and is measured using dynamic light scattering (DLS) technology.

The concentrations of these abrasive particles range from 0.01 wt. % to 20 wt. %, the preferred concentrations range from 0.05 wt. % to 10 wt. %, the more preferred concentrations range from 0.1 wt. % to 5 wt. %.

The preferred abrasive particles are ceria-coated inorganic oxide particles and ceria particle. More preferred abrasive particles are ceria-coated silica particles and calcined ceria particles.

The solvent includes but is not limited to deionized (DI) water, distilled water, and alcoholic organic solvents.

The preferred solvent is DI water.

The CMP slurry may contain biocide from 0.0001 wt. % to 0.05 wt. %; preferably from 0.0005 wt. % to 0.025 wt. %, and more preferably from 0.001 wt. % to 0.01 wt. %.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one or 2-methyl-4-isothiazolin-3-one.

The CMP slurry may contain a pH adjusting agent.

An acidic or basic pH adjusting agent can be used to adjust the polishing compositions to the optimized pH value.

The pH adjusting agents include, but are not limited to nitric acid, hydrochloric acid, sulfuric acid, phosphoric acid, other inorganic or organic acids, and mixtures thereof.

pH adjusting agents also include the basic pH adjusting agents, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The CMP slurry contains 0 wt. % to 1 wt. %; preferably 0.01 wt. % to 0.5 wt. %; more preferably 0.1 wt. % to 0.25 wt. % pH adjusting agent.

The CMP slurry contains 0.01 wt. % to 20 wt. %, 0.025 wt. % to 10 wt. %, 0.05 wt. % to 5 wt. %, or 0.1 to 3.0 wt. % of the chemical additives as oxide trenching dishing and total defect count reducers.

The chemical additives as oxide trenching dishing reducers contain at least two or more, preferably four or more, more preferably six or more hydroxyl functional groups in their molecular structures.

In one embodiment, the chemical additive has a general molecular structure as shown below:

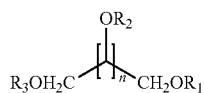

In the general molecular structure, n is selected from 2 to 5,000, from 3 to 12, preferably from 4 to 7.

R1, R2, and R3 can be the same or different atoms or functional groups.

Each of Rs in the group of R1 to R3 can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four of them are hydrogen atoms.

When R1, R2, and R3 are the same and are hydrogen atoms, the chemical additive bears multi hydroxyl functional groups.

The molecular structures of some examples of such chemical additives are listed below:

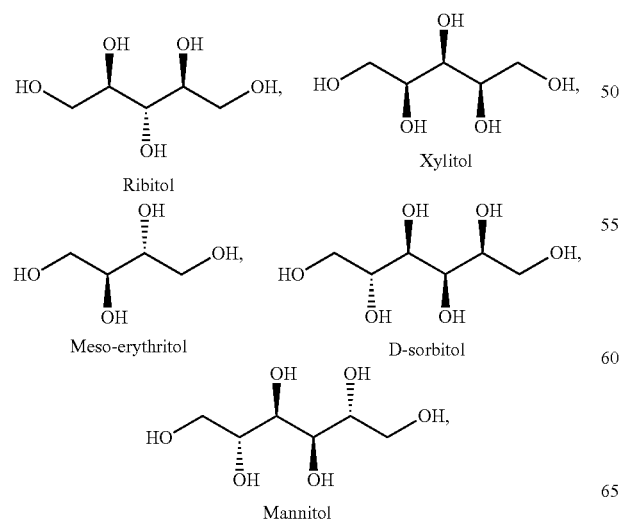

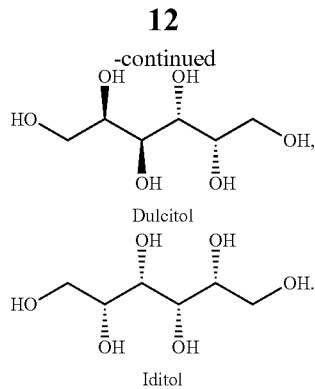

In another embodiment, the chemical additive has a structure shown below:

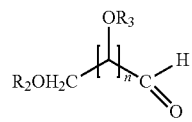

In this structure, one —CHO functional group is located at one end of the molecule as the terminal functional group; n is selected 2 to 5,000, from 3 to 12, preferably from 4 to 7.

R1 and R2 can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof.

When R1 and R2 are all hydrogen atoms, and n=3, the chemical additive is D-arabinose or L-arabinose.

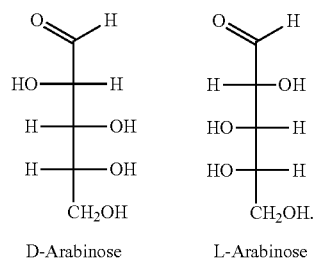

When R1, R2 and R3 are all hydrogen atoms, and n=4, the chemical additive is D-mannose or L-mannose.

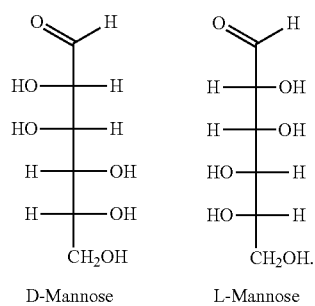

In yet another embodiment, the chemical additive has a molecular structure selected from the group comprising of at least one (f), at least one (g), at least one (h) and combinations thereof;

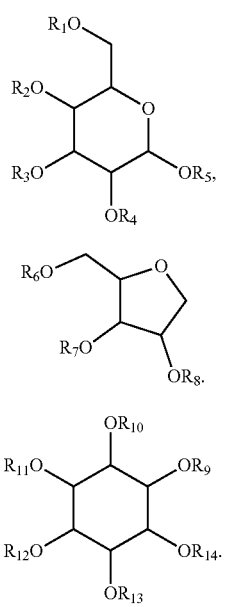

(f)

(g)

(h)

In these general molecular structures; R1, R2, R3, R4, R5, R6, R7 R8, R9, R10, R11, R12, R13, and R14 can be the same or different atoms or functional groups.

They can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four or more of them are hydrogen atoms.

When R1, R2, R3 R4, R5, R6, R7 R8, R9, R10, R11, R12, R13, and R14 are all hydrogen atoms which provide the chemical additives bearing multi hydroxyl functional groups.

The molecular structures of some examples of such chemical additives are listed below:

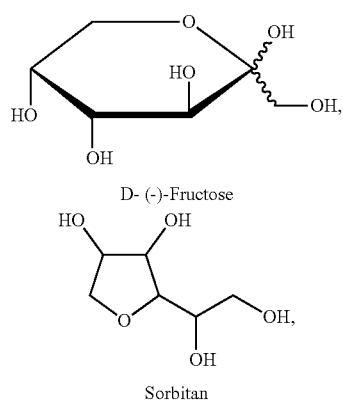

D-(-)-Fructose

Sorbitan

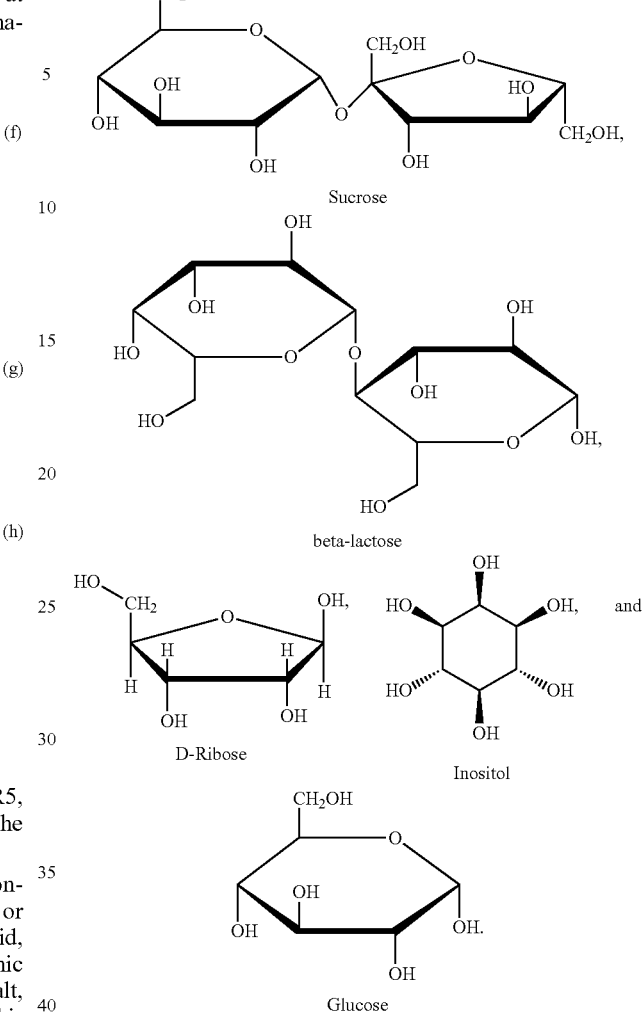

Sucrose beta-lactose

D-Ribose

Inositol

Glucose

Yet, in another embodiment, the chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing hydroxyl groups.

The chemical additives as oxide trenching dishing reducers contain at least two, at least four, or at least six hydroxyl functional groups in their molecular structures.

The general molecular structure for the chemical additives is shown in (a):

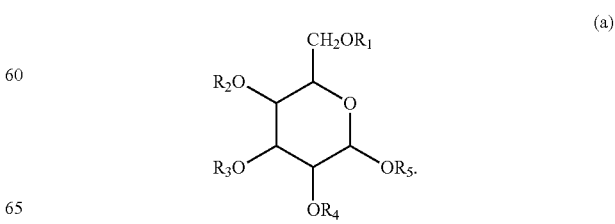

(a)

In one embodiment, at least one R in the group of R1 to R5 in the general molecular structure is a polyol molecular unit having a structure shown in (b):

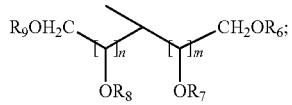

(b)

wherein n and m can be the same or different. m or n is independently selected from 1 to 5, preferably from 1 to 4, more preferably from 1 to 3, and most preferably from 1 to 2; R6 to R9 can be the same or different atoms or functional groups; and the rest of Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

In another embodiment, at least one R in the group of R1 to R5 in the general molecular structure is a polyol molecular unit having a structure shown in (b); at least one R in the group of R1 to R5 in the general molecular structure is a six-member ring polyol as shown in (c):

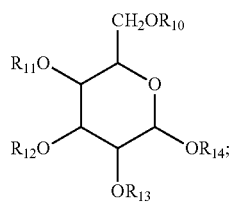

(c)

wherein one of OR in group of OR11, OR12, OR13 and OR14 will be replaced by O in structure (a); and R10 and each of other R in the group of R10, R11, R12, R13 and R14 is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;

and the rest of Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

In the general molecular structure, at least two, preferably four, more preferably six of the Rs in the group of R1 to R9 are hydrogen atoms.

When only one R, such as R5 in the group of R1 to R5 in the general molecular structure is a polyol molecular unit (b) having n=2 and m=1; and all rest of Rs in the group of R1 to R9 are all hydrogen atoms, the following two chemical additives are obtained:

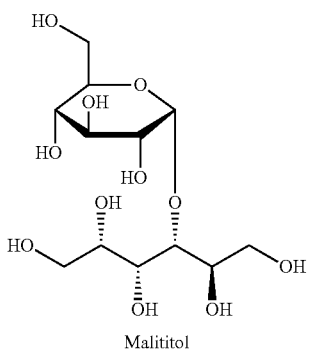

Malitol

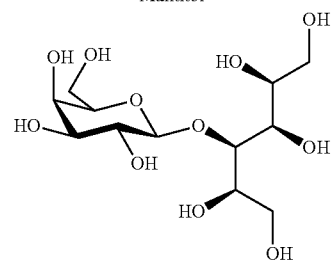

Lactitol

When one R, such as R5 is a polyol molecular unit (b) having n=2 and m=1; and one R, such as R2 is a six-member ring polyol; and all rest of Rs in the group of R1 to R14 are all hydrogen atoms, the following chemical additive is obtained:

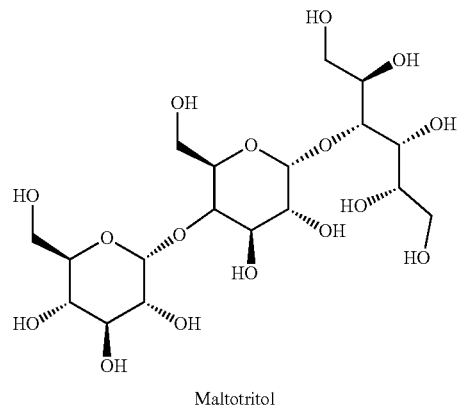

Maltotritol

The chemical additive comprises maltitol, lactitol, maltotritol, ribitol, D-sorbitol, mannitol, dulcitol, iditol, D-(−)-Fructose, sorbitan, sucrose, Inositol, glucose, D-arabinose, L-arabinose, D-mannose, L-mannose, meso-erythritol, ribose, beta-lactose, and combinations thereof. The preferred chemical additives are maltitol, lactitol, maltotritol, D-sorbitol, mannitol, dulcitol, iditol, D-(−)-Fructose, sucrose, ribose, Inositol, glucose. D-(+)-mannose, beta-lactose, and combinations thereof. The more preferred chemical additives are maltitol, lactitol, maltotritol, D-sorbitol, mannitol, dulcitol, D-(−)-Fructose, beta-lactose, and combinations thereof.

In some embodiments, the CMP polishing compositions can be made into two or more parts and mixed at the point of use.

In another aspect, there is provided a method of chemical mechanical polishing (CMP) a substrate having at least one surface comprising silicon dioxide using the chemical mechanical polishing (CMP) composition described above. The polished oxide films can be CVD oxide, PECVD oxide, High density oxide, or Spin on oxide films.

The polished oxide films can be Chemical vapor deposition (CVD), Plasma Enhance CVD (PECVD), High Density Deposition CVD (HDP), spin on oxide films, flowable CVD oxide film, carbon doped oxide film, nitrogen doped oxide film, or combinations thereof.

The substrate disclosed above can further comprises a silicon nitride surface. The removal selectivity of $SiO_2$:SiN is greater than 10, preferably greater than 20, and more preferably greater than 30.

Dishing performance of the CMP compositions can also be characterized by the ratio of oxide trench dishing rate (Å/min.) vs the blanket HDP film removal rate (Å/min.).

The smaller of this ratio is, the lower oxide trench dishing is.

The CMP compositions having the ratio of ≤0.1, 0.08, 0.06, 0.05, 0.03, or 0.02 provide good oxide dishing performance.

In CMP polishing compositions, it is very important to keep abrasive particles stable to assure consistent desired CMP polishing performance.

When using the chemical additives in the CMP polishing compositions, these chemical additives can have some impacts on the stability of abrasive particles in the compositions.

For example, when maltitol, lactitol or their derivatives, are used as oxide trench reducing agents in polishing compositions, these chemical additives can have some impacts on the stability of ceria-coated inorganic oxide abrasives in the CMP polishing compositions.

Typically, the abrasive particle stability is tested by monitoring the mean particle size (MPS) (nm) and particle size distribution parameter D99 (nm) changes vs the times or at elevated temperatures.

Particle size distribution may be quantified as a weight percentage of particles that has a size lower than a specified size. For example, parameter D99 (nm) represents a particle size (diameter) where 99 wt. % of all the slurry particles would have particle diameter equal to or smaller than the D99 (nm). That is, D99 (nm) is a particle size that 99 wt. % of the particles fall on and under.

The smaller of MPS (nm) and D99 (nm) changes, the more stable of the abrasive particles are and thus the CMP polishing compositions are.

Particle size distribution can be measured by any suitable techniques such as imaging, dynamic light scattering, hydrodynamic fluid fractionation, disc centrifuge etc.

MPS (nm) and D99 (nm) are both measured by dynamic light scattering in this application.

CMP compositions providing abrasive particle stability have the changes for MPS (nm) and D99 (nm) 6.0%, 5.0%, 3.0%, 2.0%, 1.0%, 0.5%, 0.3% or 0.1% for a shelf time of at least 30 days, 40 days, 50 days, 60 days, 70 days or 100 days at a temperature ranging from 20 to 60° C., 25 to 50° C.

The following non-limiting examples are presented to further illustrate the present invention.

CMP Methodology

In the examples presented below, CMP experiments were run using the procedures and experimental conditions given below.

GLOSSARY

Components

Calcinate ceria particles: used as abrasives having a particle size of approximately 150 nanometers (nm); such ceria-coated silica particles can have a particle size of ranged from approximately 5 nanometers (nm) to 500 nanometers (nm).

Ceria-coated Silica: used as abrasive having a particle size of approximately 100 nanometers (nm); such ceria-coated silica particles can have a particle size of ranged from approximately 5 nanometers (nm) to 500 nanometers (nm); Ceria-coated Silica particles (with varied sizes) were supplied by JGC Inc. in Japan.

Chemical additives, such as D-sorbitol, dulcitol, fructose, maltitol, lactitol and other chemical raw materials were supplied by Sigma-Aldrich, St. Louis, Mo.

TEOS: tetraethyl orthosilicate

Polishing Pad: Polishing pad, IC1010 and other pads were used during CMP, supplied by DOW, Inc.

PARAMETERS

General

Å or A: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: slurry flow, ml/min
Wt. %: weight percentage (of a listed component)
TEOS: SiN Selectivity: (removal rate of TEOS)/(removal rate of SiN)
HDP: high density plasma deposited TEOS
TEOS or HDP Removal Rates: Measured TEOS or HDP removal rate at a given down pressure. The down pressure of the CMP tool was 2.5 psi, 3.0 psi or 3.3 psi or 4.3 psi in the examples.
SiN Removal Rates: Measured SiN removal rate at a given down pressure. The down pressure of the CMP tool was 3.0 psi in the examples listed.

Metrology

Films were measured with a ResMap CDE, model 168, manufactured by Creative Design Engineering, Inc, 20565 Alves Dr., Cupertino, Calif., 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, Calif., 95054. An IC1000 pad supplied by DOW, Inc, 451 Bellevue Rd., Newark, Del. 19713 was used on platen 1 for blanket and pattern wafer studies.

The IC1010 pad or other pad was broken in by conditioning the pad for 18 mins. At 7 lbs. down force on the conditioner. To qualify the tool settings and the pad break-in two tungsten monitors and two TEOS monitors were polished with Versum® STI2305 slurry, supplied by Versum Materials Inc. at baseline conditions.

Wafers

Polishing experiments were conducted using PECVD or LECVD or HD TEOS wafers. These blanket wafers were purchased from Silicon Valley Microelectronics, 2985 Kifer Rd., Santa Clara, Calif. 95051.

Polishing Experiments

In blanket wafer studies, oxide blanket wafers, and SiN blanket wafers were polished at baseline conditions. The tool baseline conditions were: table speed; 87 rpm, head speed: 93 rpm, membrane pressure; 2.5 psi, 3.0 psi or 3.3 psi or 4.3 psi, inter-tube pressure; 3.1 psi or others, retaining ring pressure; 5.1 psi or others, The slurry was used in polishing experiments on patterned wafers (MIT860), supplied by SWK Associates, Inc. 2920 Scott Blvd. Santa Clara, Calif. 95054). These wafers were measured on the Veeco VX300 profiler/AFM instrument. The 3 different sized pitch structures were used for oxide dishing measurement. The wafer was measured at center, middle, and edge die positions.

TEOS:SiN Selectivity: (removal rate of TEOS)/(removal rate of SiN) obtained from the CMP polishing compositions were tunable.

WORKING EXAMPLES

In the following working examples, a polishing composition comprising 0.2 wt. % cerium-coated silica, a biocide ranging from 0.0001 wt. % to 0.05 wt. %, and deionized water was prepared as reference (ref.).

The polishing compositions were prepared with the reference (0.2 wt. % cerium-coated silica, a biocide ranging from 0.0001 wt. % to 0.05 wt. %, and deionized water) plus a chemical additive in 0.01 wt. % to 2.0 wt. %.

All examples, except pH condition examples the composition had a pH at 5.35.

pH adjusting agent used for acidic pH condition and alkaline pH condition were nitric acid and ammonium hydroxide respectively.

Example 1

The working slurries has 0.15 wt. % chemical additives added to the reference slurry.

The effects of various selected chemical additives on the film removal rates and selectivity were observed.

The removal rates (RR at Å/min) for different films were tested. The test results were listed in Table 1.

TABLE 1

Effects of Chemical Additives on Film RR
(A/min.) & TEOS: SiN Selectivity

| Samples | TEOS-RR (ang/min) | HDP-RR (ang/min) | SiN-RR (ang/min) | TEOS: SiN Selectivity |
|---|---|---|---|---|
| 0.2 wt. % Ceria-coated Silica (Ref.) | 3279 | 2718 | 349 | 9 |
| Ref. + 0.15 wt. % D-Sorbitol | 2394 | 2299 | 75 | 32 |

TABLE 1-continued

Effects of Chemical Additives on Film RR
(A/min.) & TEOS: SiN Selectivity

| Samples | TEOS-RR (ang/min) | HDP-RR (ang/min) | SiN-RR (ang/min) | TEOS: SiN Selectivity |
|---|---|---|---|---|
| Ref. + 0.15 wt. % D-Mannitol | 2741 | 2372 | 124 | 22 |
| Ref. + 0.15 wt. % D-(+)-Mannose | 2839 | 2104 | 148 | 19 |
| Ref. + 0.15 wt. % Xylitol | 2694 | 2256 | 109 | 25 |
| Ref. + 0.15 wt. % meso-Erythritol | 2808 | 2064 | 366 | 8 |

As the results showed in Table 1, the slurries based on ceria-coated silica offered higher removal rate for TEOS.

As the results further showed in Table 1, the chemical additives D-sorbitol, D-mannitol, D-mannose, and xylitol, except meso-erythritol suppressed SiN removal rates comparing with the Ref., while still afforded high TEOS and HDP film removal rates and provided high Oxide:SiN selectivity.

Example 2

In Example 2, 0.2 wt. % ceria-coated silica abrasive based formulation without chemical additives was used as reference.

The chemical additives were used at 0.15 wt. % (0.15×) concentrations respectively with 0.2 wt. % ceria-coated silica as abrasives in the working slurries.

The effects of various selected chemical additives on the oxide trenching dishing vs over polishing times were observed.

The test results were listed in Table 2. HDP RR (A/min.) from Table 1 was also listed in Table 2.

TABLE 2

Effects of Chemical Additives on Oxide Trench
Dishing & HDP RR (A/min.)

| Compositions | OP Time (sec.) | 100 um pitch dishing | 200 um pitch dishing | Blanket HDP RR (A/min.) |
|---|---|---|---|---|
| 0.2% Ceria-coated Silica pH 5.35 | 0 | 165 | 291 | 2718 |
| | 60 | 857 | 1096 | |
| | 120 | 1207 | 1531 | |
| 0.2% Ceria-coated Silica + 0.15X D-Sorbitol | 0 | 137 | 276 | 2299 |
| | 60 | 247 | 411 | |
| | 120 | 380 | 544 | |
| 0.2% Ceria-coated Silica + 0.15X D-mannitol | 0 | 162 | 285 | 2372 |
| | 60 | 368 | 580 | |
| | 120 | 563 | 816 | |
| 0.2% Ceria-coated Silica + 0.15X D-(+)-Mannose | 0 | 181 | 272 | 2401 |
| | 60 | 660 | 973 | |
| | 120 | 1121 | 1553 | |
| 0.2% Ceria-coated Silica + 0.15X Xylitol | 0 | 144 | 258 | 2256 |
| | 60 | 485 | 800 | |
| | 120 | 760 | 1166 | |
| 0.2% Ceria-coated Silica + 0.15X meso-Erythritol | 0 | 131 | 265 | 2064 |
| | 60 | 732 | 896 | |
| | 120 | 1125 | 1392 | |

TABLE 3

The Ratio of Trench Dishing Rate (Å)/Blanket HDP RR (Å/min.)

| Compositions | P100 Dishing Rate (Å/min.)/Blanket HDP RR (Å/min.) | P200 Dishing Rate (Å/min.)/Blanket HDP RR (Å/min.) |
|---|---|---|
| 0.2% Ceria-coated Silica pH 5.35 | 0.13 | 0.16 |
| 0.2% Ceria-coated Silica + 0.15X D-Sorbitol | 0.06 | 0.06 |
| 0.2% Ceria-coated Silica + 0.15X D-mannitol | 0.08 | 0.12 |
| 0.2% Ceria-coated Silica + 0.15X D-(+)-Mannose | 0.2 | 0.24 |
| 0.2% Ceria-coated Silica + 0.15X Xylitol | 0.12 | 0.16 |
| 0.2% Ceria-coated Silica + 0.15X meso-Erythritol | 0.19 | 0.24 |

Table 3 listed the ratio of oxide trench dishing rate (Å/min.) vs the blanket HDP film removal rate (Å/min.), As the results shown in Tables 2 and 3, the addition of various chemical additives as oxide trench dishing reducer in polishing compositions showed different effects.

The polishing compositions using D-sorbitol and D-mannitol provided significant oxide trench dishing reductions on both 100 μm pitch and 200 μm pitch respectively, comparing to the reference.

The polishing composition using xylitol showed no impact on oxide trench dishing in polishing comparing to the reference. The polishing compositions using D-(+)-mannose or meso-erythritol had the oxide trench dishing worse than the reference.

The effects of chemical additives on the slopes of oxide trenching dishing vs over polishing removal amounts were listed in Table 4.

TABLE 4

Effects of Chemical Additives on Slopes of Dishing vs OP Removal Amount

| Compositions | P100 dishing/OP Amt Slope | P200 dishing/OP Amt Slope | P1000 dishing/OP Amt Slope |
|---|---|---|---|
| 0.2X Ceria-coated Silica | 0.19 | 0.23 | 0.25 |
| 0.2X Ceria-coated Silica + 0.15x D-Sorbitol | 0.05 | 0.06 | 0.08 |
| 0.2X Ceria-coated Silica + 0.15x D-Mannitol | 0.08 | 0.11 | 0.40 |
| 0.2X Ceria Coated + 0.15x D-(+)-Mannose | 0.20 | 0.27 | 0.38 |
| 0.2X Ceria-coated Silica + 0.15x Xylitol | 0.14 | 0.20 | 0.41 |

As the results shown in Table 4, the polishing composition using D-sorbitol or D-mannitol afforded much lower slope values of oxide trench dishing vs over polishing amounts on 100 μm and 200 μm features while comparing to the reference.

The other additives offered no dishing improvements comparing to the reference.

Example 3

The effects of various selected chemical additives on the film removal rates (RR at Å/min) and selectivity were observed. These chemical additives were used at 0.1 wt. % concentrations respectively with 0.2 wt. % ceria-coated silica as abrasives.

The test results were listed in Table 5.

TABLE 5

Effects of Chemical Additives on Film RR (A/min.) & TEOS: SiN Selectivity

| Samples | TEOS-RR (ang/min) | HDP-RR (ang/min) | SiN-RR (ang/min) | TEOS: SiN Selectivity |
|---|---|---|---|---|
| 0.2% Ceria-Coated Silica | 3279 | 2718 | 349 | 9.4 |
| +0.1x D-Sorbitol | 2968 | 2814 | 92 | 32.3 |
| +0.1x D-(-)-Fructose | 1662 | 1781 | 34 | 48.9 |
| +0.1x Maltitol | 2834 | 2679 | 38 | 74.6 |
| +0.1x Dulcitol | 3127 | 2995 | 45 | 69.5 |

As the results showed in Table 5, these chemical additives D-sorbitol, D-(-)-Fructose, Maltitol and Dulcitol suppressed SiN removal rates while comparing with reference, and still afforded high TEOS and HDP film removal rates.

TABLE 6

Effects of Chemical Additives on Oxide Trench Dishing & HDP RR (A/min.)

| Samples | OP Time (Sec.) | 100 um pitch dishing | 200 um pitch dishing | 1000 um pitch dishing | Blanket HDP RR (A/min.) |
|---|---|---|---|---|---|
| 0.2% Ceria-coated Silica | 0 | 165 | 291 | 1013 | 2718 |
| | 60 | 857 | 1096 | 1821 | |
| | 120 | 1207 | 1531 | 2392 | |
| 0.2% Ceria-coated Silica + 0.1x D-Sorbitol | 0 | 98 | 184 | 432 | 2814 |
| | 60 | 261 | 383 | 1494 | |
| | 120 | 418 | 583 | 1936 | |
| 0.2% Ceria-coate Silica + 0.1x D-(-)-Fructose | 0 | 123 | 229 | 694 | 1781 |
| | 60 | 315 | 372 | 962 | |
| | 120 | 458 | 527 | 1175 | |
| 0.2% Ceria-coated Silica + 0.1x Maltitol | 108 | 218 | 620 | 620 | 2679 |
| | 228 | 355 | 873 | 873 | |
| | 333 | 482 | 1068 | 1068 | |
| 0.2% Ceria-coated Silica + 0.1x Dulcitol | 0 | 152 | 252 | 770 | 2995 |
| | 60 | 238 | 370 | 10 | |
| | 120 | 366 | 495 | 1081 | |

CMP composition having D-(-)-fructose suppressed removal of TEOS in addition of SiN, but still afforded high TEOS:SiN selectivity.

The effects of various selected chemical additives on the oxide trenching dishing vs over polishing times were observed.

The test results were listed in Table 6. HDP RR (A/min.) from Table 5 was also listed in Table 6.

As the oxide trench dishing vs over polishing time results showed in Table 6, the CMP compositions with chemical additives afforded lower oxide trench dishing on 100 um pitch, and 200 um pitch, respectively. The compositions provided significant oxide trench dishing reductions comparing to the reference composition.

Table 7 listed the ratio of oxide trench dishing rate (Å/min.) vs the blanket HDP film removal rate (Å/min.),

TABLE 7

The Ratio of Trench Dishing Rate (Å)/Blanket HDP RR (Å/min.)

| Compositions | P100 Dishing Rate (Å/min.)/Blanket HDP RR (Å/min.) | P200 Dishing Rate (Å/min.)/Blanket HDP RR (Å/min.) |
|---|---|---|
| 0.2X Ceria-coated Silica | 0.13 | 0.16 |
| +0.1x D-Sorbitol | 0.06 | 0.07 |
| +0.1x D-(-)-Fructose | 0.08 | 0.09 |

TABLE 7-continued

The Ratio of Trench Dishing Rate (Å)/Blanket HDP RR (Å/min.)

| Compositions | P100 Dishing Rate (Å/min.)/Blanket HDP RR (Å/min.) | P200 Dishing Rate (Å/min.)/Blanket HDP RR (Å/min.) |
|---|---|---|
| +0.1x Maltitol | 0.05 | 0.07 |
| +0.1x Dulcitol | 0.04 | 0.04 |

As the results shown in Table 7, the addition of the chemical additives to the polishing compositions significantly reduced the ratio of trench dishing rate vs the blanket HDP film removal rates than the ratio obtained from the reference sample at pH 5.35.

The slopes of the various sized pitch dishing vs oxide over polishing amounts were listed in Table 8.

As the results of slopes of the various sized pitch dishing vs oxide over polishing amounts showed in Table 8, the chemical additives and ceria-coated silica abrasives based CMP polishing compositions afforded much lower slope values comparing to those slope values obtained from the reference.

TABLE 8

Effects of Chemical Additives on Slopes of Dishing vs OP Removal Amount

| Compositions | P100 dishing/OP Amt Slope | P200 dishing/OP Amt Slope | P1000 dishing/OP Amt Slope |
|---|---|---|---|
| 0.2X Ceria-coated Silica | 0.19 | 0.23 | 0.25 |
| +0.1x D-Sorbitol | 0.06 | 0.07 | 0.27 |
| +0.1x D-(-)-Fructose | 0.09 | 0.08 | 0.14 |
| +0.1x Maltitol | 0.04 | 0.05 | 0.08 |
| +0.1x Dulcitol | 0.04 | 0.04 | 0.05 |

Example 4

In Example 4, the removal rates, and TEOS:SiN selectivity were tested tests were performed with CMP polishing compositions with chemical additives having different concentrations at pH 5.35.

The test results were listed in Table 9.

TABLE 9

Effects of Additive Conc. on Film RR (A/min.) & Selectivity of Oxide: SiN

| Samples | TEOS-RR (ang/min) | HDP-RR (ang/min) | SiN-RR (ang/min) | TEOS: SiN Sel. |
|---|---|---|---|---|
| 0.2% Ceria-coated Silica + 0.0x D-Sorbitol | 3595 | 3128 | 110 | 33 |
| 0.2% Ceria-coated Silica + 0.1x D-Sorbitol | 3821 | 3425 | 112 | 34 |
| 0.2% Ceria-coated Silica + 0.15x D-Sorbitol | 3651 | 3517 | 83 | 44 |

As the results showed in Table 9, when the concentration of D-sorbitol used in the compositions increased, similar TEOS removal rates were obtained, and HPD film removal rates were increased and TEOS:SiN selectivity were also increased slightly or significantly.

The effects on the oxide trenching dishing vs over polishing times from the selected chemical additive D-sorbitol concentrations on the various sized pitch features were tested.

The test results were listed in Table 10.

TABLE 10

Effects of Chemical Additive D-Sorbitol Conc. On Oxide Trench Dishing vs OP Times(sec.)

| Compositions | Polish Time (Sec.) | 100 um pitch dishing | 200 um pitch dishing | Blanket HDP RR |
|---|---|---|---|---|
| 0.2% Ceria-coated Silica + 0.05x D-Sorbitol | 0 | 198 | 332 | 3128 |
|  | 60 | 453 | 690 |  |
|  | 120 | 573 | 842 |  |
| 0.2% Ceria-coated Silica + 0.1x D-Sorbitol | 0 | 182 | 288 | 3425 |
|  | 60 | 355 | 551 |  |
|  | 120 | 499 | 736 |  |
| 0.2% Ceria-coated Silica + 0.15x D-Sorbitol | 0 | 132 | 246 | 3517 |
|  | 60 | 269 | 423 |  |
|  | 120 | 423 | 595 |  |

As the results showed in Table 10, all 3 tested CMP polishing compositions contained D-sorbitol with different concentrations gave low oxide trench dishing on both 100 μm pitch and 200 μm pitch.

Also, as the chemical additive D-sorbitol concentrations increased, the oxide trench dishing are further reduced.

As the results showed in Table 10, all 3 tested CMP polishing compositions contained D-sorbitol with different concentrations gave low oxide trench dishing on both 100 μm pitch and 200 μm pitch.

Also, as the chemical additive D-sorbitol concentrations increased, the oxide trench dishing are further reduced.

TABLE 11

Ratio of Trench Dishing Rate (Å)/Blanket HDP RR (Å/min.) vs Conc. of D-Sorbitol

| Compositions | P100 Dishing Rate (Å/min.)/Blanket HDP RR (Å/min.) | P200 Dishing Rate (Å/min.)/Blanket HDP RR (Å/min.) |
|---|---|---|
| 0.2% Ceria-coated Silica + 0.05X D-Sorbitol | 0.04 | 0.05 |
| 0.2% Ceria-coated Silica + 0.1X D-Sorbitol | 0.04 | 0.05 |
| 0.2% Ceria-coated Silica + 0.15X D-Sorbitol | 0.04 | 0.05 |

Table 11 listed the ratio of Trench Dishing Rate (Å)/Blanket HDP RR (Å/min.) from the compositions with different concentrations of D-Sorbitol.

As the results shown in Table 11, D-sorbitol used in the composition at pH 5.35, all significantly reduced the ratio of trench dishing rate vs the blanket HDP film removal rates across the different tested concentrations.

Therefore, D-sorbitol can be used as an effective oxide trench dishing reducer in the wide concentration range The slopes of the various sized pitch dishing vs oxide over polishing amounts were tested and the results were listed in Table 12.

TABLE 12

Effects of Additive Conc. on Slopes of Dishing vs OP Removal Amount

| Compositions | P100 dishing/OP Amt Slope | P200 dishing/OP Amt Slope |
|---|---|---|
| STI2305 (Reference) | 0.01 | 0.01 |
| 0.2% Ceria-coated Silica + 0.05x D-Sorbitol | 0.06 | 0.08 |
| 0.2% Ceria-coated Silica + 0.1x D-Sorbitol | 0.05 | 0.07 |
| 0.2% Ceria-coated Silica + 0.15x D-Sorbitol | 0.04 | 0.05 |

As the results of slopes of the various sized pitch dishing vs oxide over polishing amounts showed in Table 12, different concentrations of D-sorbitol in CMP polishing compositions all afforded similar slope values comparing to the reference sample.

Also, as the D-sorbitol concentration increased, the slopes of the various sized pitch dishing vs oxide over polishing while at over polishing time at zero seconds gradually decreased.

Example 5

In Example 5, the tests were performed with CMP polishing compositions having different pH values.

The composition composed of 0.2 wt. % ceria-coated silica as abrasives and 0.1 wt. % D-sorbitol as chemical additive was tested at three different pH conditions.

The removal rates (RR at Å/min) for different films were tested. The test results were listed in Table 13.

TABLE 13

Effects of pH on Film RR (A/min.) & Selectivity of Oxide: SiN

| 0.2% Ceria-coated Silica + 0.1% D-Sorbitol | TEOS-RR (ang/min) | HDP-RR (ang/min) | SiN-RR (ang/min) | TEOS: SiN Sel. |
|---|---|---|---|---|
| pH 5.35 | 3821 | 3425 | 112 | 34 |
| pH 6 | 3759 | 3415 | 131 | 29 |
| pH 8 | 2932 | 3084 | 94 | 31 |

As the results showed in Table 10, the compositions showed a consistent performance by offering high TEOS and HDP film removal rates, low SiN removal rates, and high TEOS: SiN selectivity in acidic, neutral or alkaline pH conditions.

The test results on the effects of pH conditions using the CMP polish compositions on oxide trench dishing vs over polishing times were listed in Table 14.

As the results showed in Table 14, similar oxide trenching dishing vs over polishing times and HDP film removal rates were obtained for the same concentration of ceria-coated silica as abrasives and D-sorbitol as oxide trenching dishing reducing agent at 3 different pH conditions.

TABLE 14

Effects of pH Conditions on Oxide Trench Dishing vs Over Polishing Times(sec.) & HDP Film RR (A/min.)

| Compositions & pH | Polish Time (Sec.) | 100 um pitch dishing | 200 um pitch dishing | Blanket HDP RR |
|---|---|---|---|---|
| 0.2% Ceria-coated Silica + 0.1x D-Sorbitol (pH 5.35) | 0 | 182 | 288 | 3425 |
| | 60 | 355 | 551 | |
| | 120 | 499 | 736 | |
| 0.2% Ceria-coated Silica + 0.1x D-Sorbitol (pH 6) | 0 | 169 | 325 | 3415 |
| | 60 | 354 | 566 | |
| | 120 | 506 | 800 | |
| 0.2% Ceria-coated Silica + 0.1x D-Sorbitol (pH 8) | 0 | 193 | 360 | 3084 |
| | 60 | 391 | 615 | |
| | 120 | 537 | 814 | |

Table 15 showed the results of the ratio of Trench Dishing Rate (Å)/Blanket HDP RR (Å/min.),

TABLE 15

Ratio of Trench Dishing Rate (Å)/Blanket HDP RR (Å/min.) at Different pH

| Compositions | P100 Dishing Rate (Å/min.)/Blanket HDP RR (Å/min.) | P200 Dishing Rate (Å/min.)/Blanket HDP RR (Å/min.) |
|---|---|---|
| 0.2% Ceria-coated Silica + 0.1X D-Sorbitol (pH 5.35) | 0.04 | 0.05 |
| 0.2% Ceria-coated Silica + 0.1X D-Sorbitol (pH 6) | 0.04 | 0.07 |
| 0.2% Ceria-coated Silica + 0.1X D-Sorbitol (pH 7) | 0.05 | 0.06 |

As the results shown in Table 15, the addition of the chemical additives, D-sorbitol, used as oxide trench dishing reducer in polishing compositions at different pH conditions, showed significantly reduction of the ratio which indicated that D-sorbitol can be used as a very effective oxide trench dishing reducing agent at wide pH window.

Example 6

In Example 6, the effects of various selected chemical additives from afore listed several types of chemical additives on the film removal rates and selectivity were observed.

The same molar concentrations of all tested chemical additives at 8.132 mM was used respectively.

All examples, except examples for the pH condition test had a pH at 5.35.

For the examples used in the pH condition test, pH adjusting agent was used for acidic pH condition and alkaline pH condition were nitric acid and ammonium hydroxide respectively.

The removal rates (RR at Å/min) and removal selectivity for different films were tested. The test results were listed in Table 16.

TABLE 16

Effects of 8.132 mM Concentration of Chemical Additives on Film RR (A/min.) & TEOS: SiN Selectivity

| Compositions | TEOS RR (A/min.) | HDP RR (A/min.) | PECVD SiN RR (A/min.) | TEOS: SiN Selectivity |
|---|---|---|---|---|
| 0.2% Ceria-coated Silica | 2764 | 1886 | 432 | 6.4 |
| 0.2% Ceria-coated Silica + 8.132 mM Maltitol | 2609 | 2493 | 45 | 58.4 |
| 0.2% Ceria-coated Silica + | 2862 | 2512 | 114 | 25.1 |

TABLE 16-continued

Effects of 8.132 mM Concentration of Chemical Additives on Film RR
(A/min.) & TEOS: SiN Selectivity

| Compositions | TEOS RR (A/min.) | HDP RR (A/min.) | PECVD SiN RR (A/min.) | TEOS: SiN Selectivity |
|---|---|---|---|---|
| 8.132 mM Ribose 0.2% Ceria-coated Silica + 8.132 mM Arabinose | 2963 | 1985 | 393 | 7.5 |
| 0.2% Ceria-coated Silica + 8.132 mM Beta-lactose | 2913 | 2186 | 115 | 25.3 |
| 0.2% Ceria-coated Silica + 8.132 mM Myo-Inositol | 2899 | 2026 | 201 | 14.4 |

As the results showed in Table 16, these chemical additives, when used at 8.132 mM concentrations in the polishing compositions afforded similar TEOS film removal rates, HDP film removal rates, slightly or significantly suppressed SiN removal rates comparing with the reference.

The Oxide:SiN selectivity was fluctuating from slightly increased (arabinose, myo-inositol) to significantly increased (maltitol, ribose and beta-lactose). Among these tested chemical, maltitol showed as the most efficient SiN removal rate suppressing chemical additive, and ribose and beta-lactose also showed as quite efficient SiN removal rate suppressing additives.

Example 7

The following chemical additives, maltitol, D-sorbitol, lactitol, ribose, and beta-lactose were used in the polishing compositions with 0.2 wt. % ceria-coated silica abrasives at pH 5.35 to have conducted polishing tests on polishing oxide patterned wafers. The chemical additives were used at 0.15 wt. % in the compositions.

The effects of various chemical additives on the film removal rates and selectivity were observed.

The test results were listed in Table 17.

TABLE 17

Effects of Chemical Additives on Film RR
(A/min.) & TEOS: SiN Selectivity

| Composition | TEOS RR (A/min) | HDP RR (A/min) | SiN RR (A/min) | TEOS: SiN Selectivity |
|---|---|---|---|---|
| 0.2% Ceria-coated Silica pH 5.35 | 4310 | 3047 | 557 | 8 |
| 0.2% Ceria-coated Silica + 0.15% D-sorbitol | 3605 | 3992 | 65 | 36 |
| 0.2% CPOP + 0.15% Maltitol | 4505 | 4203 | 61 | 39 |
| 0.2% CPOP + 0.15% Lactitol | 4563 | 4183 | 85 | 41 |
| 0.2% CPOP + 0.15% Ribose | 4517 | 4325 | 103 | 39 |
| 0.2% CPOP + 0.15% Beta-Lactose | 4716 | 4049 | 80 | 46 |

As the results showed in Table 17, all compositions afforded similar high TEOS film removal rates, increased HDP film high removal rates, significantly suppressed SiN removal rates, significantly increased Oxide:SiN selectivity comparing with the reference sample.

The effects of various chemical additives on the oxide trenching dishing vs over polishing times were observed. These chemical additives were used at 0.15 wt. % (0.15×) concentrations respectively with 0.2 wt. % ceria-coated silica as abrasive, and with all formulations at pH 5.35.

The test results were listed in Table 18.

As the oxide trench dishing vs over polishing time results showed in Table 18, all of these chemical additives, when used with ceria-coated silica abrasives in the CMP polishing compositions, afforded largely reduced oxide trench dishing vs over polishing times at 60 seconds or 120 seconds respectively on 100 μm pitch and 200 μm pitch features, and provided significant oxide trench dishing reductions comparing to the reference.

TABLE 18

Effects of Chemical Additives on Oxide Trench Dishing & HDP RR (A/min.)

| Compositions | OP Time (sec.) | 100 um pitch dishing | 200 um pitch dishing |
|---|---|---|---|
| 0.2% Ceria-coated Silica pH 5.35 | 0 | 165 | 291 |
|  | 60 | 857 | 1096 |
|  | 120 | 1207 | 1531 |
| 0.2% Ceria-coated Silica + 0.15% Sorbitol | 0 | 94 | 222 |
|  | 60 | 216 | 351 |
|  | 120 | 314 | 475 |
| 0.2% Ceria-coated Silica + 0.15% Maltitol | 0 | 135 | 261 |
|  | 60 | 293 | 463 |
|  | 120 | 413 | 641 |
| 0.2% Ceria-coated Silica + 0.15% Lactitol | 0 | 120 | 193 |
|  | 60 | 313 | 436 |
|  | 120 | 468 | 646 |
| 0.2% Ceria-coated Silica + 0.15% Ribose | 0 | 88 | 176 |
|  | 60 | 290 | 409 |
|  | 120 | 441 | 606 |
| 0.2% Ceria-coated Silica + 0.15% Beta-Lactose | 0 | 141 | 259 |
|  | 60 | 387 | 587 |
|  | 120 | 579 | 870 |

As the oxide trench dishing vs over polishing time results showed in Table 18, all of these chemical additives, when used with ceria-coated silica abrasives in the CMP polishing compositions, afforded largely reduced oxide trench dishing vs over polishing times at 60 seconds or 120 seconds respectively on 100 μm pitch and 200 μm pitch features, and provided significant oxide trench dishing reductions comparing to the reference.

Table 19 showed the results of the ratio of Trench Dishing Rate (Å)/Blanket HDP RR (Å/min.),

TABLE 19

Ratio of Trench Dishing Rate (Å)/Blanket HDP RR (Å/min.)

| Compositions | P100 Dishing Rate (Å/min.)/Blanket HDP RR (Å/min.) | P200 Dishing Rate (Å/min.)/Blanket HDP RR (Å/min.) |
|---|---|---|
| 0.2% Ceria-coated Silica pH 5.35 | 0.13 | 0.16 |
| 0.2% Ceria-coated Silica + 0.15% Sorbitol | 0.02 | 0.03 |

TABLE 19-continued

Ratio of Trench Dishing Rate (Å)/Blanket HDP RR (Å/min.)

| Compositions | P100 Dishing Rate (Å/min.)/Blanket HDP RR (Å/min.) | P200 Dishing Rate (Å/min.)/Blanket HDP RR (Å/min.) |
| --- | --- | --- |
| 0.2% Ceria-coated Silica + 0.15% Ma ltitol | 0.05 | 0.04 |
| 0.2% Ceria-coated Silica + 0.15% Lactitol | 0.04 | 0.05 |
| 0.2% Ceria-coated Silica + 0.15% Ribose | 0.03 | 0.05 |
| 0.2% Ceria-coated Silica + 0.15% Beta-Lactose | 0.05 | 0.07 |

As the results shown in Table 19, all tested polishing compositions using chemical additives showed significantly reduction of the ratio of trench dishing rate vs the blanket HDP film removal rates which indicated that all these chemical additives can be used as very effective oxide trench dishing reducing agents in the invented CMP polishing compositions.

Working Example 8

The polishing compositions were prepared with the reference (0.2 wt. % ceria-coated silica, a biocide ranging from 0.0001 wt. % to 0.05 wt. %, and deionized water) and maltitol or lactitol were used at 0.28 wt. %.

All example compositions had a pH at 5.35.

The removal rates (RR at Å/min) for different films were tested. The effects of two selected chemical additives, maltitol and lactitol on the film removal rates and selectivity were observed.

The test results were listed in Table 20.

TABLE 20

Effects of Maltitol or Lactitol on Film RR (Å/min.) & TEOS: SiN Selectivity

| Compositions | TEOS Film RR (Å/min.) | HDP Film RR (Å/min.) | SiN Film RR (Å/min.) | TEOS: SiN Selectivity |
| --- | --- | --- | --- | --- |
| 0.2% Ceria-coated Silica pH 5.35 | 3279 | 2718 | 349 | 9.4 |
| 0.2% Ceria-coated Silica + 0.28% Maltitol pH 5.35 | 2623 | 2639 | 46 | 57.0 |
| 0.2% Ceria-coated Silica + 0.28% Lactitol pH 5.35 | 2630 | 2547 | 55 | 47.8 |

As the results shown in Table 20, the addition of the chemical additives, maltitol or lactitol, in the polishing compositions, significantly suppressed SiN removal rates while still afforded high TEOS and HDP film removal rates, thus, significantly increased Oxide:SiN film polishing selectivity.

Example 9

The example compositions in Example 8 were used in this Example.

Oxide trenching dishing for without/or with different over polishing times were tested. The effects of maltitol or lactitol on the oxide trenching dishing vs over polishing times were observed.

The test results were listed in Table 21.

TABLE 21

Effects of Maltitol or Lactitol on Oxide Trench Dishing vs OP Times (Sec.)

| Compositions | OP Times (Sec.) | 100 um pitch dishing | 200 um pitch dishing |
| --- | --- | --- | --- |
| 0.2% Ceria-coated Silica pH 5.35 Ref. | 0 | 165 | 291 |
| | 60 | 857 | 1096 |
| | 120 | 1207 | 1531 |
| 0.2% Ceria-coated Silica + 0.28% Maltitol pH 5.35 | 0 | 408 | 616 |
| | 60 | 480 | 713 |
| | 120 | 542 | 803 |
| 0.2% Ceria-coated Silica + 0.28% Lactitol pH 5.35 | 0 | 349 | 563 |
| | 60 | 438 | 702 |
| | 120 | 510 | 779 |

As the results shown in Table 21, the polishing compositions with the addition of the chemical additives, maltitol or lactitol, afforded low oxide trench dishing on 100 μm pitch, and 200 μm pitch respectively when 60 second or 120 second over polishing times were applied.

The compositions provided significant oxide trench dishing reductions comparing to the reference composition which did not have the chemical additives, maltitol or lactitol.

Table 22 showed the results of the ratio of Trench Dishing Rate (Å)/Blanket HDP RR (Å/min.),

TABLE 22

The Ratio of Trench Dishing Rate (A)/Blanket HDP RR (A/min.)

| Compositions | P100 Dishing Rate (Å/min.)/Blanket HDP RR (A/min.) | P200 Dishing Rate (Å/min.)/Blanket HDP RR (A/min.) |
| --- | --- | --- |
| 0.2% Ceria-coated Silica pH 5.35 | 0.13 | 0.16 |
| 0.2% Ceria-coated Silica + 0.28% Maltitol pH 5.35 | 0.02 | 0.03 |

TABLE 22-continued

The Ratio of Trench Dishing Rate (A)/Blanket HDP RR (A/min.)

| Compositions | P100 Dishing Rate (Å/min.)/Blanket HDP RR (Å/min.) | P200 Dishing Rate (Å/min.)/Blanket HDP RR (Å/min.) |
|---|---|---|
| 0.2% Ceria-coated Silica + 0.28% Lactitol pH 5.35 | 0.03 | 0.03 |

As the results shown in Table 22, the addition of either maltitol or lactitol as oxide trench dishing reducer in polishing compositions significantly reduced the ratio of trench dishing rate vs the blanket HDP film removal rates, the lower of this ratio is, the lower of oxide trench dishing is.

The slopes of oxide trench dishing vs the OP removal amount was showed in Table 23.

TABLE 23

Effects of Maltitol or Lactitol on Slopes of Dishing vs OP Removal Amount

| Compositions | P100 dishing/OP Amt Slope | P200 dishing/OP Amt Slope | P1000 dishing/OP Amt Slope |
|---|---|---|---|
| 0.2% Ceria-coated Silica pH 5.35 Ref. | 0.19 | 0.23 | 0.25 |
| 0.2% Ceria-coated Silica + 0.28% Maltitol pH 5.35 | 0.04 | 0.05 | 0.08 |
| 0.2% Ceria-coated Silica + 0.28% Lactitol pH 5.35 | 0.04 | 0.06 | 0.09 |

The results listed in Table 23 indicated that the compositions with chemical additives, maltitol or lactitol provided lower slopes which indicated good over polishing window for maintaining low oxide trench dishing even more oxide film removed in over polishing steps.

As showing in Table 23, these chemical additives, maltitol or lactitol, and ceria-coated silica based CMP polishing compositions again showed much lower slope values comparing to those slope values obtained for the ceria-coated silica abrasive based reference sample.

Example 10

In Example 10, the trench oxide loss rates were compared for the polishing compositions using maltitol or lactitol and reference as listed in Table 24.

TABLE 24

Effects of Maltitol or Lactitol on Trench Loss Rates (Å/min.)

| Compositions | P100 Trench Loss Rate (Å/sec.) | P200 Trench Loss Rate (Å/sec.) |
|---|---|---|
| 0.2% Ceria-coated Silica pH 5.35 Ref. | 18.5 | 19.3 |
| 0.2% Ceria-coated Silica + 0.28% Maltitol pH 5.35 | 2.0 | 2.5 |
| 0.2% Ceria-coated Silica + 0.28% Lactitol pH 5.35 | 2.3 | 2.6 |

As the results shown in Table 24, the addition of maltitol or lactitol as oxide trench dishing reducing agent into the polishing compositions, the trench loss rates were significantly reduced vs the reference sample without using any chemical additives.

Example 11

The compositions were prepared as shown in Table 19.

The compositions used of 0.2 wt. % ceria-coated silica as abrasives, 0.28 wt. % lactitol as chemical additive, biocide, DI water, and a pH adjusting agent to provide different pH conditions.

The removal rates (RR at Å/min) for different films were tested. The effects of pH conditions on the film removal rates and selectivity were observed.

The test results were listed in Table 25.

TABLE 25

Effects of pH on Film RR (Å/min) & Selectivity of Oxide: SiN

| Compositions | TEOS Film RR (Å/min.) | HDP Film RR (Å/min.) | SiN Film RR (Å/min.) | TEOS: SiN Selectivity |
|---|---|---|---|---|
| 0.2% Ceria-coated Silica pH 5.35 | 3279 | 2718 | 349 | 9.4 |
| 0.2% Ceria-coated Silica + 0.28% Lactitol pH 5.35 | 2623 | 2639 | 46 | 57.0 |
| 0.2% Ceria-coated Silica + 0.28% Lactitol pH 7.0 | 2524 | 2517 | 56 | 45.1 |
| 0.2% Ceria-coated Silica + 0.28% Lactitol pH 8.0 | 2401 | 2417 | 52 | 46.2 |

As the results shown in Table 25, the addition of lactitol as oxide trench dishing reducing agent into the polishing compositions at three different pH conditions, (acidic, neutral or alkaline) gave similar TEOS and HDP film removal rates, very effectively suppressed SiN film removal rates, and yielded much higher TEOS:SiN selectivity than the reference sample without using lactitol as chemical additive.

Oxide trenching dishing for without/or with lactitol as chemical additive over polishing times were tested.

The effects of lactitol containing polishing composition at different pH conditions on the oxide trenching dishing vs over polishing times were observed.

The test results were listed in Table 26.

As the results shown in Table 26, the polishing compositions with the addition of lactitol, at different pH conditions afforded low oxide trench dishing on 100 μm pitch, and 200 μm pitch respectively when 60 second or 120 second over polishing times were applied.

The compositions with lactitol as oxide trench dishing reducing agent provided significant oxide trench dishing reductions comparing to the reference polishing composition which did not have the chemical additive, lactitol.

TABLE 26

Effects of Lactitol at Different pH Conditions on Oxide Trench Dishing vs OP Times (Sec.)

| Compositions | OP Times (Sec.) | 100 um pitch dishing | 200 um pitch dishing |
|---|---|---|---|
| 0.2% Ceria-coated Silica pH 5.35 Ref. | 0 | 165 | 291 |
| | 60 | 857 | 1096 |
| | 120 | 1207 | 1531 |
| 0.2% Ceria-coated Silica + 0.28% Lactitol pH 5.35 | 0 | 349 | 563 |
| | 60 | 438 | 702 |
| | 120 | 510 | 779 |
| 0.2% Ceria-coated Silica + 0.28% Lactitol pH 7.0 | 0 | 73 | 182 |
| | 60 | 222 | 390 |
| | 120 | 346 | 532 |

TABLE 26-continued

Effects of Lactitol at Different pH Conditions on Oxide Trench Dishing vs OP Times (Sec.)

| Compositions | OP Times (Sec.) | 100 um pitch dishing | 200 um pitch dishing |
|---|---|---|---|
| 0.2% Ceria-coated Silica + 0.28% Lactitol pH 8.0 | 0 | 269 | 386 |
|  | 60 | 425 | 576 |
|  | 120 | 568 | 766 |

Table 27 depicted the ratio of Trench Dishing Rate (A)/Blanket HDP RR (A/min.) at Different pH.

TABLE 27

Ratio of Trench Dishing Rate (A)/Blanket HDP RR (A/min.) at Different pH

| Compositions | P100 Dishing Rate (Å/min.)/Blanket HDP RR (A/min.) | P200 Dishing Rate (Å/min.)/Blanket HDP RR (A/min.) |
|---|---|---|
| 0.2% Ceria-coated Silica pH 5.35 | 0.13 | 0.16 |
| 0.2% Ceria-coated Silica + 0.28% Lactitol pH 5.35 | 0.03 | 0.03 |
| 0.2% Ceria-coated Silica + 0.28% Lactitol pH 7.0 | 0.05 | 0.06 |
| 0.2% Ceria-coated Silica + 0.28% Lactitol pH 8.0 | 0.06 | 0.08 |

As the results shown in Table 27, the addition of lactitol as oxide trench dishing reducer in polishing composition significantly reduced the ratio of trench dishing rate vs the blanket HDP film removal rates at different pH conditions than that ratio obtained for reference sample at pH 5.35.

TABLE 28

Effects of Lactitol at Different pH on Slopes of Dishing vs OP Removal Amount

| Compositions | P100 dishing/OP Amt Slope | P200 dishing/OP Amt Slope |
|---|---|---|
| 0.2% Ceria-coated Silica pH 5.35 | 0.19 | 0.23 |
| 0.2% Ceria-coated Silica + 0.28% Lactitol pH 5.35 | 0.04 | 0.06 |
| 0.2% Ceria-coated Silica + 0.28% Lactitol pH 7.0 | 0.06 | 0.08 |
| 0.2% Ceria-coated Silica + 0.28% Lactitol pH 8.0 | 0.06 | 0.08 |

The results listed in Table 28 indicated that the compositions with chemical additive lactitol at different pH conditions provided lower slopes of trench dishing vs the over polishing removal amounts which indicated good over polishing window for maintaining low oxide trench dishing even more oxide film removed in over polishing steps.

As showing in Table 28, lactitol and ceria-coated silica based CMP polishing compositions again showed much lower slope values at different pH conditions comparing to those slope values obtained for the ceria-coated silica abrasive based reference sample at pH 5.35.

In Example 11, the trench oxide loss rates were compared for the polishing compositions using lactitol at different pH conditions or without using lactitol at pH 5.35 and listed in Table 29.

TABLE 29

Effects of Lactitol at Different pH Conditions on Trench Loss Rates (Å/min.)

| Compositions | P100 Trench Loss Rate (Å/sec.) | P200 Trench Loss Rate (Å/sec.) |
|---|---|---|
| 0.2% Ceria-coated Silica pH 5.35 Ref. | 18.5 | 19.3 |
| 0.2% Ceria-coated Silica + 0.28% Lactitol pH 5.35 | 2.3 | 2.6 |
| 0.2% Ceria-coated Silica + 0.28% Lactitol pH 7.0 | 3.3 | 4.0 |
| 0.2% Ceria-coated Silica + 0.28% Lactitol pH 8.0 | 3.7 | 4.2 |

As the results shown in Table 29, the addition of lactitol as oxide trench dishing reducing agent into the polishing compositions at different pH conditions, the trench loss rates were significantly reduced vs the reference sample without using lactitol as chemical additive.

The polishing test results obtained at different pH conditions using lactitol as oxide trench dishing reducer proved that the CMP polishing compositions can be used in wide pH range including acidic, neutral or alkaline pH conditions.

Example 12

When using the suitable chemical additives, such as maltitol or lactitol or their derivatives, as oxide trench reducing agents in polishing compositions, these chemical additives can have some impacts on the stability of ceria-coated inorganic oxide abrasives in the CMP polishing compositions.

In CMP polishing compositions, it is very important to have good abrasive particle stability to assure constant and desirable CMP polishing performances.

Typically, the abrasive particle stability is tested through monitoring the MPS (nm) (=mean particle size) and D99 (nm) changes vs the times or at elevated temperatures. The smaller of MPS (nm) and D99 (nm) changes, the more stable of the invented polishing compositions are.

In this example, the stability of ceria-coated silica abrasive particles in the compositions having chemical additives was monitored by measuring the change of the mean particles size and the change of particle size distribution D99.

The testing samples were made using 0.2 wt. % or other wt. % ceria-coated silica abrasive; very low concentration of biocide; 0.15 wt. % maltitol, 0.15 wt. % lactitol or 0.0787 wt. % Myo-inositol as oxide trench dishing reducer; and with pH adjusted to 5.35.

The abrasive stability tests on the polishing compositions were carried out at 50° C. for at least 10 days or more.

The MPS (nm) or D99 (nm) of the tested polishing compositions were measured using DLS technology (DLS=dynamic light scattering).

The stability test results of the used ceria-coated silica abrasives with the chemical additives were listed in Table 30.

TABLE 30

Particle Size Stability (MPS) Test Results@50° C. - D99(nm)

| Compositions | Days | | | | | | | |
|---|---|---|---|---|---|---|---|---|
| | 0 | 1 | 2 | 3 | 4 | 11 | 18 | 32 |
| 0.2% Ceria-coated Silica + 0.15% Maltitol | 179.6 | 179.6 | 178.4 | 179.6 | 180 | | 183 | |
| 0.2% Ceria-coated Silic + 0.15% Lactitol | 180 | 178.8 | 180.9 | 179.6 | 180.6 | | | 182.3 |
| 0.2% Ceria-coated Silic + 0.0787% Myo-hositol | 180.8 | 178.5 | 179.6 | 180.4 | 181.5 | 182.3 | | |

By day 4 at 50° C., 0.2 wt. % ceria-coated silica particles had MPS changes of
0.23%, 0.34% and 0.39% in the compositions having 0.15 wt. % maltitol, 0.15 wt. % lactitol and 0.0787 wt. % myo-inositol respectively.

0.2 wt. % ceria-coated silica particles in the composition having 0.15 wt. % maltitol had a mean particle size change of less than 1.9% by day 18 at 50° C.

0.2 wt. % ceria-coated silica particles in the composition having 0.0787 wt. % myo-inositol had a mean particle size change of less than 0.83% by day 11 at 50° C.

0.2 wt. % ceria-coated silica particles in the composition having 0.15 wt. % lactitol had a mean particle size change of less than 1.3% by day 32 at 50° C.

More stability test were listed in Table 31.

Data also showed that 0.8 wt. % of the ceria-coated silica particles had MPS and D99 changes of less than 0.41% and less than 0.23% respectively by day 42 at 50° C. in the composition having 0.6 wt. % of maltitol respectively.

1.6 wt. % of the ceria-coated silica particles had MPS and D99 changes of less than 1.2% and less than 1.6% respectively by day 42 at 50° C. in the composition having 1.2 wt. % of maltitol respectively.

2.4 wt. % of the ceria-coated silica particles had MPS and D99 changes of less than 0.33% and less than 0.23% respectively by day 42 at 50° C. in the composition having 1.8 wt. % of maltitol respectively.

As the results shown in Table 30 to 32, when maltitol, lactitol or Myo-inositol used as oxide trench dishing reducer with ceria-coated silica particles as abrasives, the polishing

TABLE 31

Particle Size Stability Test Results@50° C. - MPS (nm) & D99(nm)

| Compositions | Particle Sizes (nm) | Day 0 | Day 1 | Day 4 | Day 8 | Day 15 | Day 22 | Day 33 | Day 40 | Day 62 |
|---|---|---|---|---|---|---|---|---|---|---|
| 0.2% Ceria-coated Silica + | MPS(nm) | 120 | 121.1 | 122.8 | 123 | 123.2 | 121.5 | 121.9 | 120.6 | 119.9 |
| 0.15% Maltitol pH 5.35 | D99(nm) | 176.3 | 178 | 180.9 | 180.4 | 180 | 172.4 | 178.3 | 176.2 | 177.4 |

0.2 wt. % ceria-coated silica particles in the composition having 0.15 wt. % maltitol had a mean particle size and D99 changes of less than $8.34 \times 10^{-4}$ and 0.63% respectively by day 62 at 50° C.

Furthermore, the particle stability tests were also conducted at 50° C. on polishing compositions comprised more concentrated ceria-coated silica abrasives (more than 0.2 wt. %) and more concentrated maltitol (more than 0.15 wt. %) as oxide trench dishing reducer.

The test results were listed in Table 32.

compositions showed very good particle size stability of MPS (nm) and D99 (nm) even at elevated testing temperatures.

The polishing compositions comprised of ceria-coated colloidal silica abrasives and more concentrated maltitol as oxide trench dishing reducer all showed very good particle size stability of MPS (nm) and D99 (nm) at elevated temperatures.

TABLE 32

Particle Size Stability Test Results@50° C. - MPS (nm) & D99(nm)

| Compositions | Particle Sizes (nm) | Day 0 | Day 3 | Day 5 | Day 7 | Day 14 | Day 19 | Day 25 | Day 42 |
|---|---|---|---|---|---|---|---|---|---|
| 0.8% Ceria-coated Silica + | MPS(nm) | 122 | 122 | 121.9 | 122 | 121 | 121 | 121.4 | 122.5 |
| 0.6% Maltitol pH 5.35 | D99(nm) | 180.5 | 179.5 | 180 | 179.6 | 185.3 | 185.3 | 179.6 | 180.9 |
| 1.6% Ceria-coated Silica + | MPS(nm) | 121.2 | 122.1 | 122.1 | 121.5 | 121.3 | 121.2 | 121.4 | 122.6 |
| 1.2% Maltitol pH 5.35 | D99(nm) | 179.5 | 180 | 180 | 179.2 | 179.6 | 179.6 | 180.5 | 182.3 |
| 2.4% Ceria-coated Silica + | MPS(nm) | 122.1 | 121.9 | 121.5 | 121.1 | 121 | 121 | 122 | 122.5 |
| 1.8% Maltitol pH 5.35 | D99(nm) | 180.5 | 180 | 179.2 | 178 | 180.1 | 180.1 | 180.5 | 180.9 |

Data showed that 0.8 wt. % of the ceria-coated silica particles had MPS and D99 changes of less than 0.41% and less than 0.23% respectively by day 42 at 50° C. in the composition having 0.6 wt. % of maltitol respectively.

Example 13

Another key benefit of using the present invented CMP polishing compositions is the reduced total defect counts through and post-polishing which is resulted in by using the ceria-coated colloidal silica composite particles as abrasives instead of using calcined ceria particle as abrasives.

The following three polishing compositions were prepared for defects testing. The first sample was made using 0.5 wt. % calcined ceria abrasives, 0.05 wt. % polyacrylate salt and low concentration of biocide; the second sample was made using 0.2 wt. % ceria-coated silica abrasives, 0.28 wt. % maltitol and low concentration of biocide; the third sample was made using 0.2 wt. % ceria-coated silica abrasives, 0.28 wt. % lactitol and low concentration of biocide. In order to obtain similar dielectric film removal rates to be compared, higher concentration of calcinated ceria abrasive was used in sample 1.

All three formulations have pH valued at 5.35.

The total defect counts on polished TEOS and SiN wafers were compared by using three afore listed polishing compositions. The total defect count results were listed in Table 33.

TABLE 33

Effects of Different Polishing Compositions on TEOS & SiN Total Defect Counts

| Compostions | TEOS Total Defect Count @0.13 μm LPD | SiN Total Defect Count @ 0.13μm LPD |
|---|---|---|
| 0.2% Calcined Ceria + 0.05% Polyacrylate Salt pH 5.35 | 3847 | 498 |
| 0.2% Ceria-coated Silica + 0.28% Maltitol pH 5.35 | 438 | 73 |
| 0.2% Ceria-coated Silica + 0.28% Lactitol pH 5.35 | 493 | 73 |

As the total defect count results shown in Table 33, the polishing compositions using ceria-coated silica particles as abrasives and either of maltitol or lactitol as trench dishing reducing agent afforded significantly lower total defect counts on the polished TEOS and SiN wafers than the total defect counts obtained using the polishing composition comprised of calcined ceria abrasives and polyacrylate salt as chemical additive.

Example 14

The following four polishing compositions were prepared for the defects testing.

The first two polishing compositions used calcined ceria abrasives, 0.28 wt. % maltitol or 0.28 wt. % lactitol as oxide trenching dishing reducing agent and low concentration of biocide; the other two polishing compositions were made using ceria-coated silica abrasives, 0.28 wt. % maltitol or 0.28 wt. % lactitol as oxide trenching dishing reducing agent and low concentration of biocide. All four formulations have pH valued at 5.35.

All chemical additives used at the same wt. %, but different types of abrasives were used, e.g., calcined ceria vs ceria-coated silica particles as abrasives.

The effects of different types of abrasives on the film removal rates and TEOS:SiN selectivity were observed and the results were listed in table 34.

TABLE 34

Effects of Different Types of Abrasives on Film RR & TEOS: SiN Selectivity

| Compositions | TEOS RR (A/min.) | HDP RR (A/min.) | SiN RR (Amin.) | TEOS: SiN Selectivity |
|---|---|---|---|---|
| Calcined Ceria + 0.28% Maltitol | 1774 | 1839 | 38 | 43 |
| Calcined Ceria + 0.28% Lactitol | 1997 | 1996 | 37 | 54 |
| Ceria-coated Silica + 0.28% Maltitol | 3085 | 2956 | 60 | 51 |
| Ceria-coated Silica + 0.28% Lactitol | 3188 | 2885 | 69 | 46 |

As the results shown in Table 34, the polishing compositions that used ceria-coated silica as abrasives did afford much higher TEOS and HDP film removal rates than those film removal rates obtained from the polishing compositions which used calcined ceria as abrasives.

The normalized total defect counts on polished TEOS and SiN wafers were compared by using four afore listed polishing compositions. The normalized total defect count results were listed in Table 35.

TABLE 35

Effects of Different Types of Abrasives on Normalized TEOS & SiN Total Defect Counts

| Compositions | TEOS 0.07 um LPD | TEOS 0.13 um LPD | PECVD SiN 0.1 um LPD | PECVD SiN 0.13 um LPD |
|---|---|---|---|---|
| Calcined Ceria + 0.28% Maltitol | 1.00 | 1.00 | 1.00 | 1.00 |
| Calcined Ceria + 0.28% Lactitol | 1.03 | 0.64 | 0.96 | 1.04 |
| Ceria-coated Silica + 0.28% Maltitol | 0.21 | 0.07 | 0.25 | 0.58 |
| Ceria-coated Silica + 0.28% Lactitol | 0.43 | 0.10 | 0.49 | 0.58 |

As the normalized total defect count results shown in Table 35, the polishing compositions using ceria-coated silica particles as abrasives and either maltitol or lactitol as trench dishing reducing agent afforded significantly lower normalized total defect counts on the polished TEOS and SiN wafers than the normalized total defect counts obtained using the polishing composition comprised of calcined ceria abrasives, and either maltitol or lactitol as oxide trench dishing reducing chemical additive.

Example 15

In Example 15, both calcined ceria and ceria-coated silica particles based polishing compositions were tested.

The composition comprising calcined ceria particles but no chemical additives was used as a reference.

Calcined ceria or ceria-coated silica particles were used at 1.0 wt. %, D-sorbitol and D-Mannitol were used at 2.0 wt. % respectively.

All samples have alkaline pH at 9.5. IC1010 used as polishing pad, and 3.3 psi down force was applied.

The film removal rate results were listed in Table 36.

TABLE 36

Film Removal Rates (Å/min.) vs Polishing Compositions

| Compositions | TEOS RR (Å/min.) | HDP RR (Å/min.) | SiN RR (Å/min.) |
| --- | --- | --- | --- |
| 1.0% Calcined Ceria pH 9.5 Ref. | 3509 | 3290 | 227 |
| 1.0% Calcined Ceria + 2.0% D-sorbitol pH 9.5 | 118 | 121 | 28 |
| 1.0% Calcined Ceria + 2.0% D-mannitol pH 9.5 | 181 | 144 | 29 |
| 1.0% Ceria-coated Silica + 2.0% D-sorbitol pH 9.5 | 133 | 137 | 39 |

As the results shown in Table 36, when no chemical additive was used in polishing composition, the polishing composition with 1.0 wt. % calcined ceria abrasives afforded high TEOS and HDP film removal rates at pH 9.5.

With either D-sorbitol or D-mannitol used at 2.0 wt. % as chemical additive in the polishing compositions at pH 9.5, much lower TEOS and HDP film removal rates were obtained.

It appears that the polishing compositions with such low TEOS and HDP film removal rates cannot meet the oxide film removal rate requirements in CMP applications.

It is very important to identify the suitable concentration range and the suitable ratios of abrasive/chemical additive, and optimized pH conditions in the CMP polishing compositions which are able to provide high enough oxide film removal rates and high TEOS:SiN selectivity to satisfy the CMP application needs.

Example 16

In Example 16, the weight % ratios of ceria-coated silica vs the chemical additive D-sorbitol were tested on their effects on various film polishing removal rates and on oxide trench dishing vs over polishing times.

In the composition, the ceria-coated silica abrasives was used from 0.2 wt. % to 0.4 wt. %, and D-sorbitol was used from 0.0 wt. % to 0.30 wt. %; which gave the ratio of ceria-coated silica abrasive wt. % vs the chemical additive D-sorbitol wt. % from 0.0 to 4.0. pH was 5.35 for all testing compositions.

Figure 2:
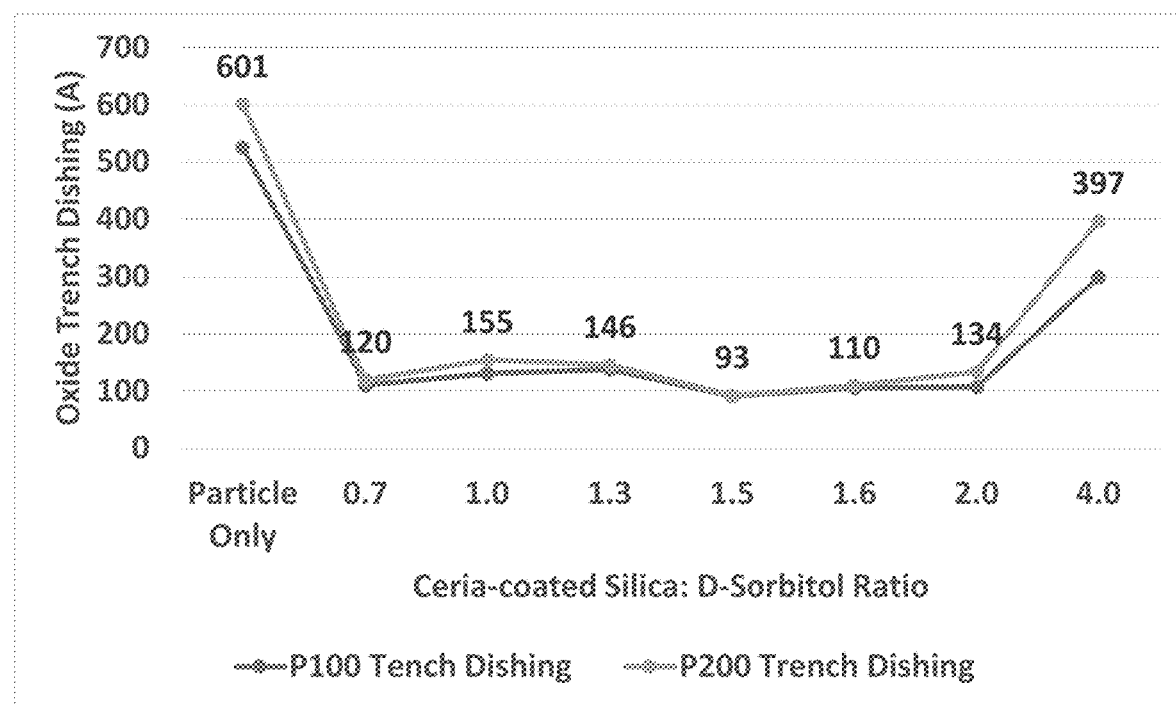
FIG. 2. Depicts the effects of Ceria-coated Silica/D-Sorbitol Ratio on Oxide Trench Dishing

The test results were depicted in FIGS. 1 and 2 respectively.

Please note, three points at 0 for both figures were for the composition having abrasive particles only i.e., not for the ratio of ceria-coated silica vs D-sorbitol, since no D-sorbitol was used in the composition.

As the results shown in FIGS. 1 and 2, when the weight % ratios of ceria-coated silica vs D-sorbitol ranged from 0.0 to 4.0, high TEOS and HDP film removal rates were high.

But at ratio of 0.0, SiN removal rate was also high, therefore, the selectivity of TEOS:SiN is low.

When the ratio of ceria-coated silica vs D-sorbitol was ranged from 0.7 to 2.0, the high TEOS and HDP film removal rates, low SiN removal rates, and high TEOS:SiN selectivity were achieved.

When this ratio was >2.0, the SiN removal rate was increased gradually and the selectivity of TEOS:SiN was decreased.

The oxide trench dishing vs over polishing times shown in FIG. 2 also shown that between 0.7 to 2.0 weight % ratio range for ceria-coated silica vs D-sorbitol was more suitable range for achieving high oxide film removal rates, low SiN removal rates, high TEOS:SiN selectivity and low oxide trench dishing.

The test results shown that the selection of the suitable ratio range of ceria-coated silica abrasive wt. % vs the chemical additive D-sorbitol wt. % allows the high oxide film removal rates, low SiN film removal rates, high selectivity of Oxide:SiN films, and low oxide trench dishing.

Example 17

In this Example, calcined ceria as abrasives and polyacrylate salt (PAA Salt) and sorbitol with different concentrations were used as chemical additives to compare the polishing performances at pH 5.35. 3.0 psi down force was applied in these polishing tests. The composition without using chemical additive was used as a reference.

The testing results were listed in Table 37.

TABLE 37

Effects of Additive Conc. on Film RR (Å/min.) & Selectivity of Oxide: SiN

| Samples | TEOS -RR (ang/min) | HDP -RR (ang/min) | PECVD SiN (ang/min) | TEOS: SiN Selectivity |
| --- | --- | --- | --- | --- |
| Calcined Ceira only | 2210 | 2313 | 110 | 20 |
| Ceria + 0.05X PAA Salt | 1657 | 1627 | 97 | 17 |
| Ceria + 0.05X D-Sorbitol | 1956 | 1990 | 68 | 29 |
| Ceria + 0.15X D-Sorbitol | 1602 | 1579 | 49 | 33 |
| Ceria + 0.3X D-Sorbitol | 1294 | 1179 | 43 | 30 |

As the results showed in Table 37, the chemical additive, PAA salt in calcined ceria particle-based formulation suppressed TEOS and HDP film removal rates and reduced SiN film removal rate and TEOS:SiN selectivity.

The chemical additive, D-sorbitol, when used in three different concentrations in calcined ceria particles based CMP polishing compositions also suppressed TEOS and HDP film removal rates, but significantly reduced SiN removal rates and thus increased TEOS:SiN selectivity from 20:1 to around 30:1.

The effects of chemical additives, PAA Salt and 3 different concentrations of D-sorbitol plus same concentrations of calcined ceria abrasive based polishing compositions on the various sized oxide trench dishing vs over polishing times were observed. The results were listed in Table 38.

As the results showed in Table 38, the chemical additive, PAA salt in calcined ceria particle-based formulation reduced oxide trench dishing while comparing to the calcined ceria only based reference.

TABLE 38

Effects of Additives or Conc. on Oxide Trench Dishing (A)

| Samples | Over Polish Time (Sec.) | 100 um pitch dishing (A) | 200 um pitch dishing (A) | 1000 um pitch dishing (A) |
|---|---|---|---|---|
| Calcined Ceria only | 0 | 96 | 184 | 779 |
|  | 60 | 949 | 1238 | 2043 |
| Ceria + 0.05X PAA Salt | 0 | 91 | 210 | 954 |
|  | 60 | 117 | 228 | 990 |
| Ceria + 0.05X D-Sorbitol | 0 | 100 | 219 | 783 |
|  | 60 | 226 | 366 | 1126 |
| Ceria + 0.15X D-Sorbitol | 0 | 101 | 213 | 700 |
|  | 60 | 166 | 280 | 787 |
| Ceria + 0.3X D-Sorbitol | 0 | 93 | 206 | 811 |
|  | 60 | 109 | 236 | 834 |

The chemical additive, D-sorbitol, when used in three different concentrations in calcined ceria particles based CMP polishing compositions also reduced oxide trench dishing across three different sized features.

When D-sorbitol used at 0.15× or 0.3× concentrations, much lower oxide trench dishing obtained than that from D-sorbitol used at 0.05× concentration vs 60 second over polishing time.

Example 18

In Example 18, the CMP polishing compositions were tested at different pH values.

The compositions composing of 0.5 wt. % calcined ceria as abrasives only or with 0.15 wt. % D-sorbitol as chemical additive.

Film removal rates were tested at two different pH conditions.

Tests on film removal rates, TEOS:SiN selectivity and oxide trench dishing were performed.

The results were listed in Table 39 and Table 40 respectively.

TABLE 39

Effects of pH on Film Removal Rates & TEOS: SiN Selectivity

| Samples | TEOS -RR (ang/min) | HDP -RR (ang/min) | PECVD SiN (ang/min) | TEOS: SiN Selectivity |
|---|---|---|---|---|
| Calcined Ceira only, pH 5.35 | 2210 | 2313 | 110 | 20 |
| Ceria + 0.15X D-Sorbitol pH 5.35 | 1602 | 1579 | 49 | 33 |
| Ceria + 0.15X D-Sorbitol pH 9.39 | 1467 | 1697 | 40 | 37 |

As the results showed in Table 39, when the STI polishing composition having 0.5 wt. % calcined ceria particles as abrasives and 0.15 wt. % D-sorbitol as a chemical additive, slightly lower TEOS removal rate was obtained at acidic pH and slightly higher HDP film removal rate was obtained at alkaline pH, and SiN removal rate was reduced from 49 Å/min. at pH 5.35 to 40 Å/min. at pH 9.39.

TABLE 40

Effects of pH Conditions on Oxide Trench Dishing (A)

| Samples | OP Times(sec.) | 100 µm Pitch Dsihing (Å) | 200 µm Pitch Dsihing (Å) | 1000 µm Pitch Dsihing (Å) |
|---|---|---|---|---|
| Calcined Ceria only pH 5.35 | 0 | 96 | 184 | 779 |
|  | 60 | 949 | 1238 | 2043 |
| Calcined Ceria + 0.5% D-sorbitol pH 5.35 | 0 | 101 | 213 | 700 |
|  | 60 | 166 | 280 | 787 |
| Calcined Ceria + 0.5% D-sorbitol pH 9.39 | 0 | 104 | 220 | 982 |
|  | 60 | 176 | 321 | 1140 |

As the results showed in Table 40, when the polishing composition having 0.5 wt. % calcined ceria particles as abrasives and 0.15 wt. % D-sorbitol as a chemical additive, low oxide trench dishing obtained on 100 µm and 200 µm pitch respectively at both pH values. Even at pH 9.39, 0.5 wt. % calcined ceria particles as abrasives and 0.15 wt. % D-sorbitol used as a chemical additive still affords more stable oxide trench dishing vs over polishing time increases.

Thus, the CMP polishing compositions provide good dishing performance at a wide pH range for CMP applications.

Example 19

In Example 19, polishing testes were on various films using the CMP polishing compositions made with calcined ceria particles or ceria-coated silica particles as abrasives and maltitol or lactitol as chemical additives at pH 5.35.

The polishing pad used was Dow's IC1010 pad, the down force used for polishing tests was 3.0 psi.

The test results on various film removal rates and TEOS:SiN selectivity were listed in Table 41.

TABLE 41

Film RR (A/min.) & TEOS: SiN Selectivity Comparison

| Compositions | TEOS RR (A/min.) | HDP RR (A/min.) | SiN RR (A/min.) | TEOS: SiN Selectivity |
|---|---|---|---|---|
| Calcined Ceria pH 5.35 Ref. 1 | 2210 | 2313 | 110 | 20 |
| Calcined Ceria + 0.15% Maltiol | 2257 | 2235 | 40 | 56 |
| Ceria-coated Silica + 0.28% Maltitol | 1774 | 1839 | 38 | 43 |
| Ceria-coated Silica + 0.28% Lactitol | 1997 | 1996 | 37 | 54 |
| Ceria-coated Silica pH 5.35 Ref. 2 | 3279 | 2718 | 349 | 9 |
| Ceria-coated Silica + 0.15% Maltitol | 3157 | 2747 | 43 | 73 |
| Ceria-coated Silica + 0.28% Maltitol | 3085 | 2956 | 60 | 51 |
| Ceria-coated Silica + 0.28% Lactitol | 3188 | 2885 | 69 | 46 |

As the results shown in Table 41, the polishing compositions having chemical additive maltitol or lactitol with either calcined ceria particles or ceria-coated silica particles offered high TEOS and good HDP film removal rates, significantly suppressed SiN film removal rates, thus, increased TEOS: SiN selectivity significantly.

Oxide trench dishing vs over polishing times at pH 5.35 were tested.

TABLE 42

Effects of Chemical Additives on
Trench Dishing vs OP Times (sec.)

| Compositions | OP Times (sec.) | 100 μm Pitch Dishing (Å) | 200 μm Pitch Dishing (Å) |
|---|---|---|---|
| Calcined Ceria pH 5.35 Ref. 1 | 0 | 96 | 184 |
|  | 60 | 949 | 1238 |
|  | 120 |  |  |
| Calcined Ceria + 0.15% Maltiol | 0 | 200 | 392 |
|  | 60 | 268 | 463 |
|  | 120 | 337 | 565 |
| Ceria-coated Silica + 0.28% Maltitol | 0 | 144 | 318 |
|  | 60 | 168 | 373 |
|  | 120 | 234 | 407 |
| Ceria-coated Silica + 0.28% Lactitol | 0 | 155 | 319 |
|  | 60 | 198 | 352 |
|  | 120 | 245 | 439 |
| Ceria-coated Silica pH 5.35 Ref. 2 | 0 | 165 | 291 |
|  | 60 | 857 | 1096 |
|  | 120 | 1207 | 1531 |
| Ceria-coated Silica + 0.15% Maltitol | 0 | 198 | 347 |
|  | 60 | 392 | 562 |
|  | 120 | 503 | 707 |
| Ceria-coated Silica + 0.28% Maltitol | 0 | 174 | 343 |
|  | 60 | 273 | 455 |
|  | 120 | 371 | 566 |
| Ceria-coated Silica + 0.28% Lactitol | 0 | 189 | 361 |
|  | 60 | 309 | 501 |
|  | 120 | 406 | 651 |

The polishing pad used was Dow's IC1010 pad, the down force used for polishing tests was 3.0 psi.

The test results on oxide trench dishing vs over polishing times were listed in Table 42.

As the results shown in Table 42, whether using calcined ceria or ceria-coated silica particles as abrasives, the polishing compositions having maltitol or lactitol at lower or higher concentrations very effectively reduced the oxide trench dishing vs over polishing times across various sized oxide trench features, and also provide more uniform and stable over polishing windows.

Example 20

All tested CMP polishing compositions had pH values at 5.35. Dow's IK4140 pad was used to replace Dow's IC1010 for When Dow's IK4140 pad was used, 4.3 psi DF was applied for polishing with calcined ceria abrasive based polishing composition, and 2.5 psi DF was applied with ceria-coated silica abrasive based polishing compositions. The same table/head speeds at 50/48 rpm were applied for all polishing compositions.

The test results on polishing various types of blanket wafers using Dow's IK4140H polishing pad were listed in Table 43.

TABLE 43

Various Polishing Compositions@Different
Polishing DF vs Film RR(Å/min.) & Selectivity

| Compositions | HDP Film RR (Å/min.) | SiN Film RR (Å/min.) | HDP: SiN Selectivity |
|---|---|---|---|
| 0.5% Ceria + 0.0506% Polyacrylate salt pH 5.35 @4.3 psi DF | 1428 | 100 | 14.3 |
| 0.2% Ceria-coated Silica + 0.15% D-Sorbitol pH 5.35 @2.5 psi DF | 1455 | 61 | 23.9 |
| 0.2% Ceria-coated Silica + 0.15% Maltitol pH 5.35 @2.5 psi DF | 1490 | 72 | 20.1 |
| 0.2% Ceria-coated Silica + 0.28% Maltitol pH 5.35 @2.5 psi DF | 1502 | 53 | 28.3 |

As the results shown in Table 43, when different polishing down forces used for different polishing compositions to polish various blanket films, very similar HDP film removal rates were obtained.

The polishing compositions using ceria-coated silica abrasives gave similar HDP film removal rates even at much lower applied down force and with lower abrasive concentrations comparing with the HDP film removal rate obtained at 4.3 psi DF using calcined ceria abrasive based polishing composition.

Also, in overall, ceria-coated silica abrasive containing polishing compositions gave lower SiN removal rates than the polishing composition using ceria particles as abrasives while comparing their SiN removal rates obtained at different polishing down forces.

The polishing test results on polishing patterned wafers at different down forces were listed in Table 44.

TABLE 44

Various Polishing Compositions@Different
Polishing DF on Polishing Patterned Wafers

| Compositions | P200 Trench Loss Rate (Å/sec.) | P200 SiN Loss Rate (Å/sec.) | P200 SiN/ HDP Blanket Ratio |
|---|---|---|---|
| 0.5% Ceria + 0.0506% Polyacrylate salt pH 5.35 @4.3 psi DF | 2.1 | 0.9 | 0.038 |
| 0.2% Ceria-coated Silica + 0.15% D-Sorbitol pH 5.35 @2.5 psi DF | 1.9 | 0.6 | 0.025 |
| 0.2% Ceria-coated Silica + 0.15% Maltitol pH 5.35 @2.5 psi DF | 2.4 | 0.7 | 0.028 |

As the patterned wafer polishing results shown in Table 44, when ceria-coated silica particles were used as abrasives and D-sorbitol or maltitol as chemical additive, the polishing compositions gave similar P200 oxide trench loss rates, lower P200 SiN loss rates and also lower SiN/HDP blanket ratio than the polishing composition using calcined ceria particles as abrasives and polyacrylate salt as chemical additive.

In another set of tests shown in Table 45, Dow's IK4250UH pad was also used with 3.0 psi DF for both polishing compositions. For the polishing tests, the same table/head speeds at 87/93 rpm were applied.

The polishing test results on polishing various types of blanket wafers using Dow's IK4250UH polishing pad were listed in Table 45.

TABLE 45

Various Polishing Compositions vs Film RR(A/min.) & Selectivity

| Compositions | HDP Film RR (Å/min.) | SiN Film RR (Å/min.) | HDP: SiN Selectivity |
| --- | --- | --- | --- |
| 0.5% Ceria + 0.0506% Polyacrylate salt pH 5.35 | 2715 | 196 | 13.9 |
| 0.2% Ceria-coated Silica + 0.15% D-Sorbitol pH 5.35 | 5913 | 114 | 51.9 |

As the results shown in Table 45, at same pH conditions, when using 0.2 wt. % ceria-coated silica particles as abrasives, and 0.15 wt. % D-Sorbitol as additives, the more suppressed SiN removal rate was obtained and 118% higher HDP film removal rate was achieved while comparing with the results using the polishing composition comprised of 0.5 wt. % calcined ceria particles as abrasives and 0.0506 wt. % polyacrylate salt as additive while using Dow's IK4250UH polishing pad.

At the same time. the HDP film:SiN selectivity was increased from 13.9:1 to 51.9:1.

The patterned wafers were also polished using Dow's IK4250UH pad. The polishing results and polishing compositions were listed in Table 46.

TABLE 46

Various Polishing Compositions on Polishing Patterned Wafers

| Compositions | P200 Trench Loss Rate (Å/sec.) | P200 SiN Loss Rate (Å/sec.) | P200 SiN/ HDP Blanket Ratio |
| --- | --- | --- | --- |
| 0.5% Ceria + 0.0506% Polyacrylate salt pH 5.35 | 6.1 | 2.2 | 0.048 |
| 0.2% Ceria-coated Silica + 0.15% D-Sorbitol pH 5.35 | 4.3 | 1.3 | 0.013 |

As the results shown in Table 46, lower P200 oxide trench loss rates, lower P200 SiN loss rates and also lower SiN/HDP blanket ratio were obtained when ceria-coated silica particles were used as abrasives and D-sorbitol as chemical additive.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A Chemical Mechanical Polishing (CMP) composition comprising:
   abrasive particles selected from the group consisting of inorganic oxide particles, metal-coated inorganic oxide particles, organic polymer particles, metal oxide-coated organic polymer particles, and combinations thereof;
   chemical additive;
   solvent selected from the group consisting of deionized (DI) water, distilled water, and alcoholic organic solvents; and
   optionally
   biocide; and
   pH adjuster;
   wherein
   the composition has a pH of 3 to 10;
   the abrasive particles have a mean particle size of 25 to 250 nm and have a concentration from 0.05 wt. % to 10 wt. %;
   the inorganic oxide particles are selected from the group consisting of ceria, colloidal silica, high purity colloidal silica, colloidal ceria, alumina, titania, zirconia particles, and combinations thereof;
   the metal-coated inorganic oxide particles are selected from the group consisting of ceria-coated inorganic oxide particles selected from the group consisting of ceria-coated colloidal silica, ceria-coated high purity colloidal silica, ceria-coated alumina, ceria-coated titania, ceria-coated zirconia particles and combinations thereof;
   the organic polymer particles are selected from the group consisting of polystyrene particles, polyurethane particles, polyacrylate particle, and combinations thereof;
   the metal-coated organic polymer particles are selected from the group consisting of ceria-coated organic polymer particles, zirconia-coated organic polymer particles, silica-coated organic polymer particles, and combinations thereof;
   the abrasive particles have changes of mean particle size MPS (nm) and D99 (nm)≤5.0% over shelf time of ≥30 days at a temperature ranging from 20 to 60° C.; wherein D99 (nm) is a particle size that 99 wt. % of the particles fall on and under; and
   the chemical additive ranges from 0.01 wt. % to 20 wt. %; and is selected from the group consisting of
   (A) a molecular structure (a):

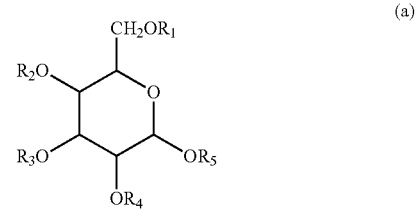

(a)

wherein the structure (a) has at least four hydroxyl functional groups in its molecular structure; and R1, R2, R3, R4 and R5 (Rs in group of R1 to R5) are selected as following
(i) at least one R in the group of R1 to R5 is a polyol molecular unit having a structure shown in (b):

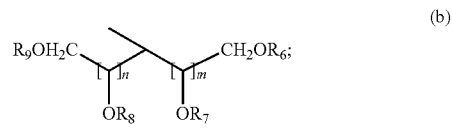

(b)

wherein m or n is independently selected from 1 to 5; and each of R6, R7, R8 and R9 is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;
and
(ii) each of other Rs in the group of R1 to R5 is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;

(B) a molecular structure selected from the group consisting of at least one (d), at least one (e), at least one (f), at least one (g), at least one (h), and combinations thereof;

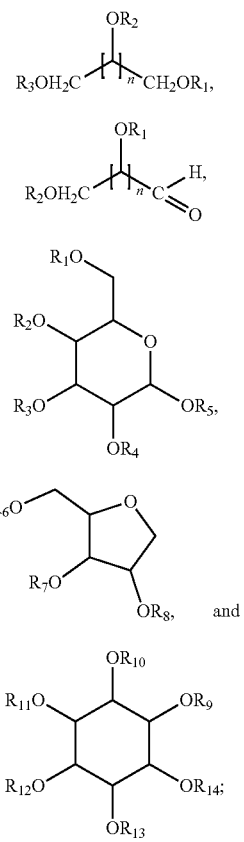

wherein n is selected from 3 to 12;

R1, R2, R3, R4, R5, R6, R7 R8, R9, R10, R11, R12, R13, and R14 can be the same or different atoms or functional groups; and each R is independently selected from the group consisting of hydrogen, oxygen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least four of them are hydrogen atoms.

2. The Chemical Mechanical Polishing (CMP) composition of claim 1, wherein the chemical additive has a molecular structure (a) having at least six hydroxyl functional groups.

3. The Chemical Mechanical Polishing (CMP) composition of claim 1, wherein the chemical additive has a molecular structure (a); and the polyol molecular unit (b) has n=2 and m=1; and rest of Rs in the group of R1 to R9 are all hydrogen atoms; and the chemical additive is

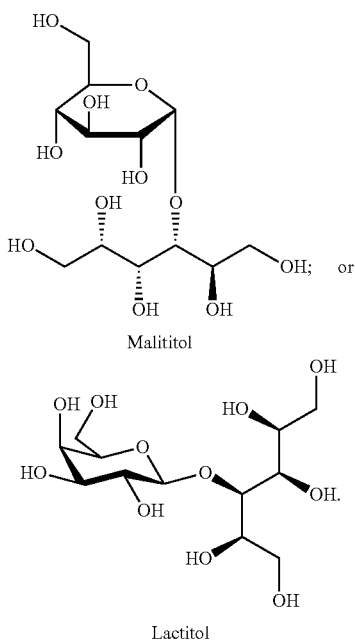

4. The Chemical Mechanical Polishing (CMP) composition of claim 1, wherein the abrasive particles are metal-coated inorganic oxide particles selected from the group consisting of ceria-coated inorganic oxide particles selected from the group consisting of ceria-coated colloidal silica, ceria-coated high purity colloidal silica, ceria-coated alumina, ceria-coated titania, ceria-coated zirconia particles and combinations thereof.

5. The Chemical Mechanical Polishing (CMP) composition of claim 1, wherein the abrasive particles are ceria-coated colloidal silica particles.

6. The Chemical Mechanical Polishing (CMP) composition of claim 1, wherein the abrasive particles have changes of mean particle size MPS (nm) and D99 (nm)≤3.0% over shelf time of ≥30 days at a temperature ranging from 20 to 60° C.; wherein D99 (nm) is a particle size that 99 wt. % of the particles fall on and under.

7. The Chemical Mechanical Polishing (CMP) composition of claim 1, wherein the chemical additive is selected from the group comprising maltitol, lactitol, D-sorbitol, mannitol, dulcitol, iditol, D-(−)-Fructose, sucrose, Inositol, glucose, L-mannose, D-mannose, beta-lactose, and combinations thereof.

8. The chemical mechanical polishing composition of claim 1, wherein the abrasive particles are ceria-coated colloidal silica particles or ceria particles; the chemical additive is selected from the group consisting of maltitol, lactitol, D-sorbitol, mannitol, dulcitol, D-(−)-Fructose, beta-lactose, and combinations thereof; and the solvent is deionized (DI) water;

wherein the abrasive particles have changes of mean particle size MPS (nm) and D99 (nm)≤2.0% over shelf time of ≥30 days at a temperature ranging from 20 to 60° C.;

wherein D99 (nm) is a particle size that 99 wt. % of the particles fall on and under.

9. The chemical mechanical polishing composition of claim 1, wherein the composition comprises one selected from the group consisting of from 0.0001 wt. % to 0.05 wt. % of the biocide having active ingredient selected from the group consisting of 5-chloro-2-methyl-4-isothiazolin-3-one, 2-methyl-1-isothiazolin-3-one, and combinations thereof; from 0 wt. % to 1 wt. % of the pH adjusting agent selected from the group consisting of nitric acid, hydrochloric acid, sulfuric acid, phosphoric acid, other inorganic or organic acids, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions; and combinations thereof.

* * * * *